(12) United States Patent
Goto et al.

(10) Patent No.: US 12,278,602 B2
(45) Date of Patent: Apr. 15, 2025

(54) POWER AMPLIFIER CIRCUIT

(71) Applicant: Murata Manufacturing Co., Ltd., Kyoto (JP)

(72) Inventors: Satoshi Goto, Kyoto (JP); Yuri Honda, Kyoto (JP); Yoshiki Kogushi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 673 days.

(21) Appl. No.: 17/503,919

(22) Filed: Oct. 18, 2021

(65) Prior Publication Data

US 2022/0123698 A1 Apr. 21, 2022

(30) Foreign Application Priority Data

Oct. 20, 2020 (JP) .................. 2020-176355

(51) Int. Cl.
*H03F 3/195* (2006.01)
*H03F 1/02* (2006.01)
*H03F 3/24* (2006.01)

(52) U.S. Cl.
CPC .......... *H03F 3/245* (2013.01); *H03F 1/0211* (2013.01); *H03F 3/195* (2013.01); *H03F 2200/168* (2013.01); *H03F 2200/318* (2013.01); *H03F 2200/451* (2013.01); *H03F 2200/541* (2013.01)

(58) Field of Classification Search
CPC ........ H03F 3/245; H03F 1/0211; H03F 3/195; H03F 2200/168; H03F 2200/318; H03F 2200/451; H03F 2200/541; H03F 2200/537; H03F 2203/45228; H03F 2203/45244; H03F 3/211; H03F 3/4508; H03F 3/19
USPC ...................................... 330/195, 295, 124 R
See application file for complete search history.

(56) References Cited

U.S. PATENT DOCUMENTS

2002/0024381 A1* 2/2002 Hayat-Dawoodi .......................... H04L 25/0266
327/560
2018/0375474 A1 12/2018 Namie

FOREIGN PATENT DOCUMENTS

JP 2018-195954 A 12/2018
JP 2020-065244 A 4/2020

* cited by examiner

*Primary Examiner* — Andrea Lindgren Baltzell
*Assistant Examiner* — Khiem D Nguyen
(74) *Attorney, Agent, or Firm* — McDonald Hopkins LLC

(57) ABSTRACT

A power amplifier circuit includes a differential amplifier circuit configured to amplify a radio-frequency signal, a transformer disposed on an output side with respect to the differential amplifier circuit and including a primary winding and a secondary winding, and a dispersion circuit coupled to a midpoint of the primary winding of the transformer and configured to operate as an adjustment circuit. The dispersion circuit is configured to adjust, based on a supply voltage controlled in accordance with the envelope of the radio-frequency signal, a bias (bias current or bias voltage) to be supplied to the differential amplifier circuit.

11 Claims, 19 Drawing Sheets

POWER AMPLIFIER CIRCUIT

CROSS REFERENCE TO RELATED APPLICATION

This application claims priority from Japanese Patent Application No. 2020-176355 filed on Oct. 20, 2020. The content of this application is incorporated herein by reference in its entirety.

BACKGROUND

The present disclosure relates to a power amplifier circuit.

In recent years, concern has arisen about increases in power consumption along with changes to fifth generation mobile communication systems. As a technology for enhancing power efficiency, envelope tracking (ET) is utilized. Envelope tracking is a technology of controlling supply voltage to a power amplifier circuit in accordance with the level of amplitude of input signal. To achieve a high efficiency characteristic with the use of envelope tracking, it is suitable to determine the range of gain depending on voltage (gain dispersion) such that the gain efficiency is optimized with respect to different levels of envelope supply voltages. Gain dispersion denotes differences in gain due to changes in power supply voltage supplied to a transistor. A dispersion circuit (hereinafter also referred to as an adjustment circuit) is used as a circuit for adjusting gain such that the gain dispersion can be represented as a plot of optimum efficiency points.

A power amplifier circuit disclosed in Japanese Unexamined Patent Application Publication No. 2020-65244 (Patent Document 1) includes an adjustment circuit. The adjustment circuit adjusts the amount of bias current supplied to an amplifier circuit in accordance with supply voltage controlled by using an envelope of radio-frequency (RF) signals. As a result, the adjustment circuit adjusts the range of gain dispersion.

Japanese Unexamined Patent Application Publication No. 2018-195954 (Patent Document 2) describes a power amplifier circuit configured to decrease bias current flowing into the base of a transistor as variable supply voltage supplied from an envelope-tracking power supply circuit lowers. The power amplifier circuit described in Patent Document 2 decreases the gain of the transistor as variable supply voltage lowers, as a result, the power amplifier circuit can improve the gain dispersion characteristic. The power amplifier circuit described in Patent Document 2 can reduce increases in gain when supply voltage is relatively low, so that the gain from relatively low supply voltage can be controlled to be substantially equal to the gain from relatively high supply voltage.

BRIEF SUMMARY

Incidentally, the gain dispersion of a power amplifier circuit including a differential amplifier circuit may affect the symmetry of the differential amplifier circuit, and thus, there is room for improvement.

The present disclosure has been made in view of the above description, and an object thereof is to provide a power amplifier circuit with appropriate gain dispersion effect while not affecting the symmetry of a differential amplifier circuit.

A power amplifier circuit according to an aspect of the present disclosure includes a differential amplifier circuit, a transformer, and an adjustment circuit. The differential amplifier circuit is configured to amplify a radio-frequency signal. The transformer is disposed on an output side with respect to the differential amplifier circuit. The transformer includes a primary winding and a secondary winding. The adjustment circuit is coupled to a midpoint of the primary winding of the transformer. The adjustment circuit is configured to adjust, based on a supply voltage controlled in accordance with an envelope of the radio-frequency signal, a bias current or bias voltage to be supplied to the differential amplifier circuit.

The present disclosure can achieve appropriate gain dispersion effect while not affecting the symmetry of a differential amplifier circuit.

Other features, elements, characteristics and advantages of the present disclosure will become more apparent from the following detailed description of embodiments of the present disclosure with reference to the attached drawings.

DETAILED DESCRIPTION

Hereinafter, embodiments of a power amplifier circuit of the present disclosure will be described in detail with reference to the drawings. It should be noted that the embodiments do not limit the present disclosure. The embodiments are mere examples and the configurations described in the different embodiments may be partially replaced or combined with each other. In second and subsequent embodiments, descriptions about specifics common to a first embodiment are not repeated and only different points will be explained. In particular, almost identical effects and advantages achieved by almost identical configurations are not repeated when appropriate and not mentioned in every embodiment.

First Embodiment

Overall Configuration of Transmit Circuit

Figure 1:
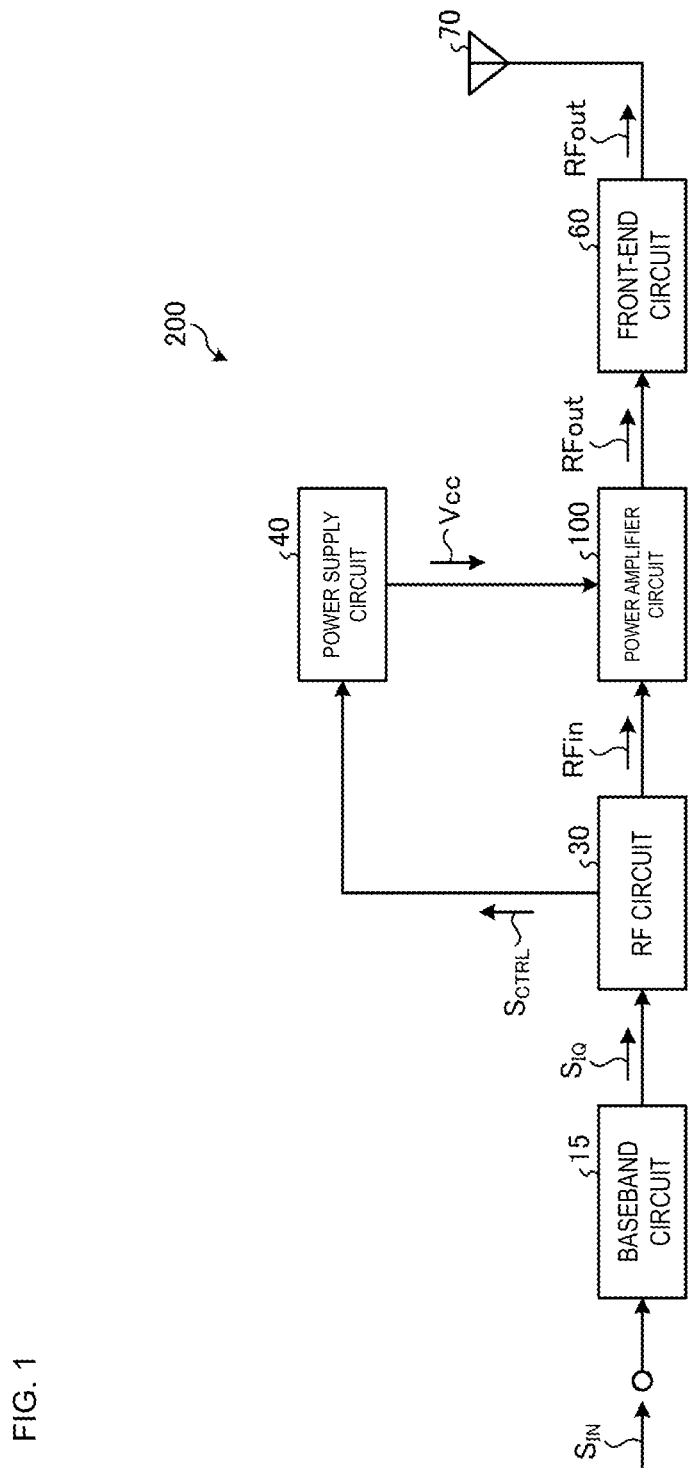
FIG. 1 illustrates a configuration of a transmit circuit including a power amplifier circuit according to a first embodiment.

FIG. 1 illustrates a configuration of a transmit circuit including a power amplifier circuit according to the first embodiment. The transmit circuit 200 is used in, for example, a wireless communication terminal device such as a mobile phone to transmit various signals representing, for example, sound and data to base stations. The wireless communication terminal device also includes a receive unit for receiving signals from base stations, but the receive unit is not described.

As illustrated in FIG. 1, the transmit circuit 200 includes a baseband circuit 15, a radio-frequency (RF) circuit 30, a power supply circuit 40, a power amplifier circuit 100, a front-end circuit 60, and an antenna 70.

The baseband circuit 15 modulates an input signal $S_{IN}$, which represents, for example, sound or data, in accordance with a modulation technology, such as High Speed Uplink Packet Access (HSUPA) or Long Term Evolution (LTE) and outputs a modulated signal $S_{IQ}$. The modulated signal $S_{IQ}$ is an IQ signal (I signal and Q signal) which represents amplitude and phase plotted on the IQ plane.

The RF circuit 30 outputs a radio-frequency input signal RFin based on the modulated signal $S_{IQ}$ outputted by the baseband circuit 15. The RF circuit 30 also detects the amplitude level of the modulated signal $S_{IQ}$. The RF circuit 30 accordingly outputs to the power supply circuit 40 a control signal $S_{CTRL}$ for controlling the power supply circuit 40 to supply a supply voltage Vcc of a level corresponding to the amplitude level of the radio-frequency input signal RFin to the power amplifier circuit 100. Specifically, the RF circuit 30 outputs to the power supply circuit 40 a control signal $S_{CTRL}$ for controlling the power supply circuit 40 to make the level of the supply voltage Vcc corresponding to the envelope of the radio-frequency input signal RFin. This means that the RF circuit 30 outputs the control signal $S_{CTRL}$ to the power supply circuit 40 to perform envelope tracking.

Instead of directly converting the modulated signal $S_{IQ}$ into the radio-frequency input signal RFin, the RF circuit 30 may firstly convert the modulated signal $S_{IQ}$ to an intermediate-frequency (IF) signal and then generate the radio-frequency input signal RFin based on the IF signal.

The power supply circuit 40 is an envelope-tracking power supply circuit configured to generate the supply voltage Vcc of a level corresponding to the control signal $S_{CTRL}$ outputted from the RF circuit 30, that is, a level corresponding to the envelope of the radio-frequency input signal RFin and outputs the supply voltage Vcc to the power amplifier circuit 100. The power supply circuit 40 may be constituted by, for example, a DC-DC converter configured to generate the supply voltage Vcc of a level corresponding to the control signal $S_{CTRL}$ from an input voltage and a linear amplifier.

The supply voltage Vcc changes in accordance with the envelope of the radio-frequency input signal RFin.

For example, in a mobile communication device, such as a mobile phone, the power amplifier circuit 100 amplifies the radio-frequency input signal RFin and outputs a radio-frequency output signal RFout. The frequency of the radio-frequency input signal RFin and the radio-frequency output signal RFout may range, for example, from about several hundreds of megahertz (MHz) to about several tens of gigahertz (GHz), but the present disclosure is not limited to this example.

The power amplifier circuit 100 amplifies the power of the radio-frequency input signal RFin outputted from the RF circuit 30 to a level suitable to transmit the signal to a base station. The power amplifier circuit 100 outputs the amplified radio-frequency output signal RFout to the front-end circuit 60.

The front-end circuit 60 performs operations including filtering for the radio-frequency output signal RFout and switching between the output signal RFout and a receive signal received from a base station. The radio-frequency output signal RFout outputted by the front-end circuit 60 is transmitted via the antenna 70 to a base station.

The power amplifier circuit 100 may be implemented as a hybrid integrated circuit (also referred to as a module) formed by mounting a plurality of components including a semiconductor integrated circuit at a single substrate, but the present disclosure is not limited to this example.

Here, for ease of understanding of the configuration and operation of the power amplifier circuit according to the embodiment, configurations and operations of power amplifier circuits according to comparative examples will be described.

First Comparative Example

Figure 2:
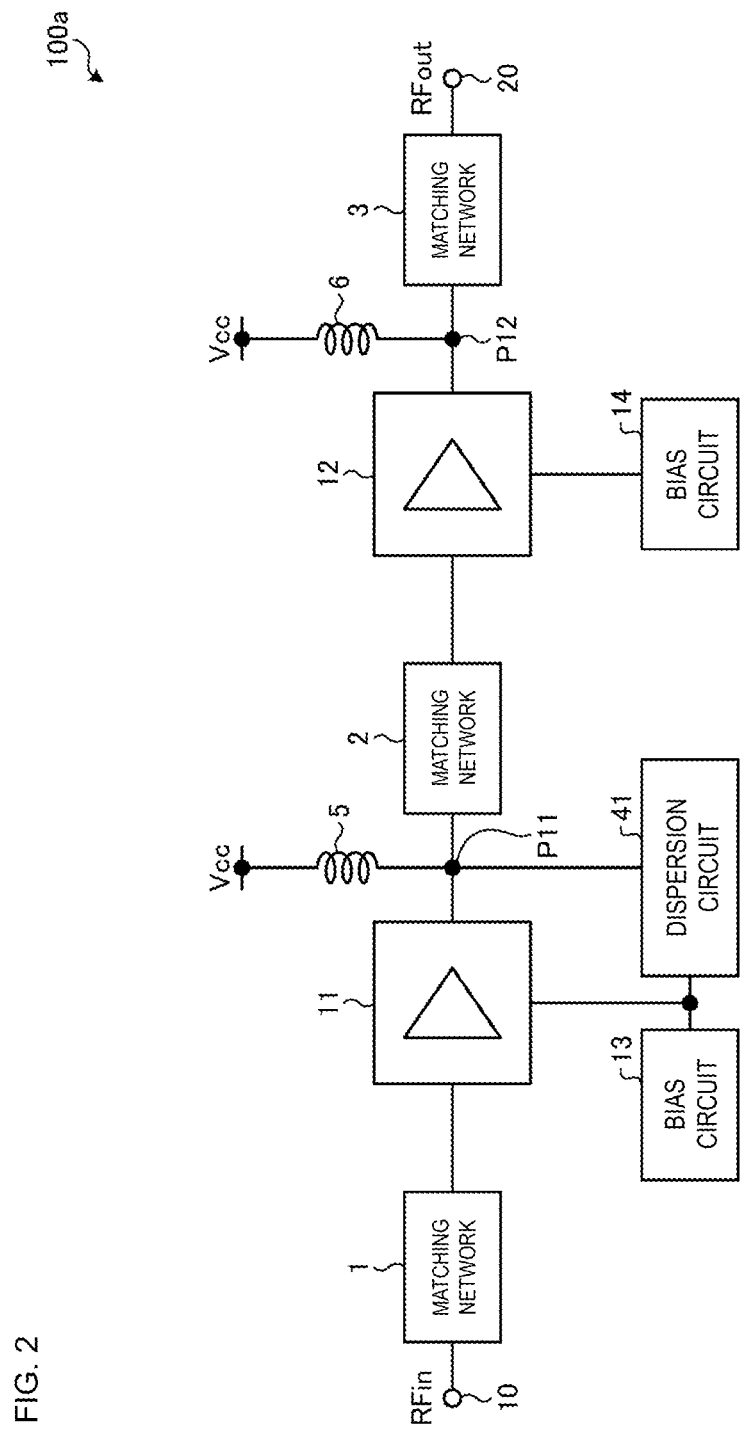
FIG. 2 illustrates a power amplifier circuit according to a first comparative example.

FIG. 2 illustrates a power amplifier circuit 100a of a first comparative example. As illustrated in FIG. 2, the power amplifier circuit 100a includes an input terminal 10, matching networks 1, 2, and 3, amplifier circuits 11 and 12, bias circuits 13 and 14, a dispersion circuit 41, an output terminal 20, and inductors 5 and 6. The radio-frequency input signal RFin is inputted to the input terminal 10. The radio-frequency output signal RFout is outputted from the output terminal 20.

The amplifier circuit 11 is an amplifier circuit in the first stage (drive stage). The amplifier circuit 12 is an amplifier circuit in the second stage (power stage). The matching network 1 is coupled to an input side of the amplifier circuit 11. The matching network 2 is coupled between the amplifier circuits 11 and 12. The matching network 3 is coupled to an output side of the amplifier circuit 12. The inductor 5 is coupled between a connection point P11 and the supply voltage Vcc. The connection point P11 is located between an output side of the amplifier circuit 11 and an input side of the matching network 2. The inductor 6 is coupled between a connection point P12 and the supply voltage Vcc. The connection point P12 is located between the output side of the amplifier circuit 12 and an input side of the matching network 3. The supply voltage Vcc is controlled in accordance with an envelope of RF signals. The power amplifier circuit 100a is activated by supply voltage that is variable in accordance with envelope tracking.

The radio-frequency input signal RFin inputted from the input terminal 10 is inputted to the matching network 1. The matching network 1 matches the impedance of a preceding-stage circuit (not illustrated in the drawing) and the impedance of the amplifier circuit 11. The connection point P11 may be provided in the matching network 2 when the connection point P11 is electrically coupled to the supply voltage Vcc. In this case, the matching network 2 may include an inductor inserted between the connection point P11 and the inductor 5. The connection point P12 may be provided in the matching network 3 when the connection point P12 is electrically coupled to the supply voltage Vcc.

The amplifier circuits 11 and 12 amplify an inputted signal and output the amplified signal. The amplifier circuits 11 and 12 are both formed by transistors.

In the present disclosure, the transistors are bipolar transistors, but this disclosure is not limited to this example. The bipolar transistor is exemplified by the heterojunction bipolar transistor (HBT), but this disclosure is not limited to this example. The transistors may be, for example, field effect transistors (FETs). In this case, collector, base, and emitter are respectively regarded as drain, gate, and source. The transistors may be multi-finger transistors formed by coupling a plurality of unit transistors (also referred to as fingers) electrically in parallel with each other. The unit transistor is the minimum unit in which a transistor is formed.

The power amplifier circuit 100a includes the bias circuits 13 and 14. The bias circuit 13 supplies a bias voltage or current to the amplifier circuit 11. The bias circuit 14 supplies a bias voltage or current to the amplifier circuit 12.

The dispersion circuit 41 is coupled to the bias circuit 13. The dispersion circuit 41 functions as an adjustment circuit for adjusting a bias (bias current or voltage) supplied by the bias circuit 13 to the amplifier circuit 11. As will be described later, the bias circuit 14 may be coupled to the dispersion circuit 41. In this case, the dispersion circuit 41 functions as an adjustment circuit for adjusting a bias voltage or current supplied by the bias circuit 14 to the amplifier circuit 12.

Dispersion Circuit and Bias Circuit

Figure 3:
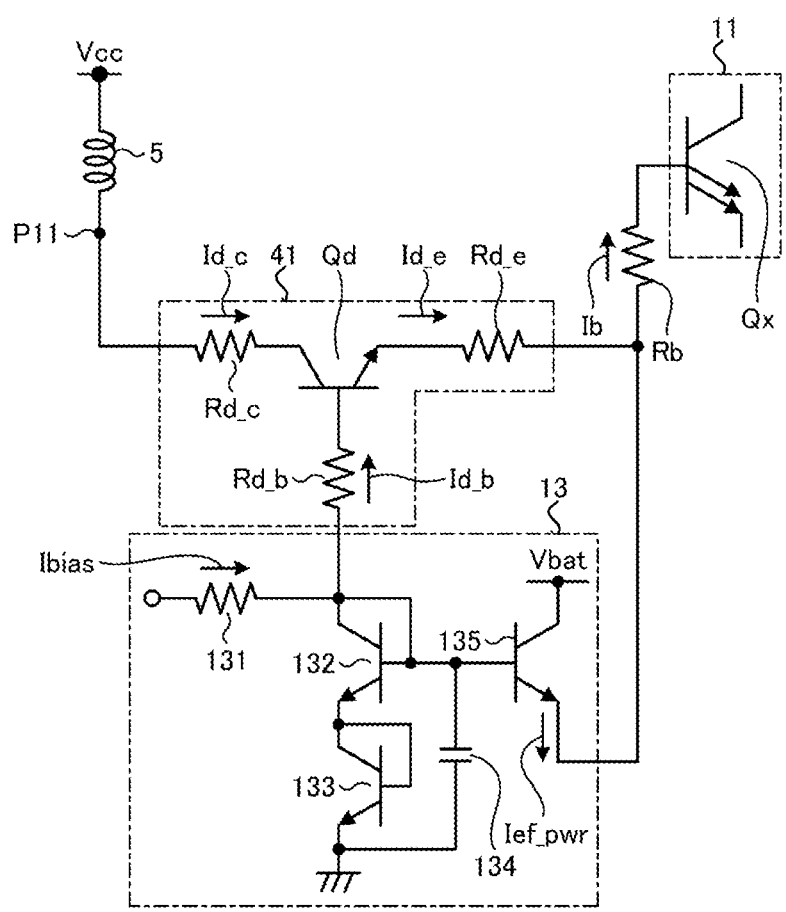
FIG. 3 illustrates a configuration example of a dispersion circuit and a bias circuit.

FIG. 3 illustrates a configuration example of the dispersion circuit 41 and the bias circuit 13.

In FIG. 3, when the bias circuit 13 is brought into focus, the bias circuit 13 includes a resistor 131, transistors 132, 133, and 135, and a capacitor 134.

A bias current Ibias of a constant amount is inputted to one end of the resistor 131. The other end of the resistor 131 is electrically coupled to the collector and base of the transistor 132.

The collector and base of the transistor 132 are electrically coupled to each other. This means that the transistor 132 is diode-connected. The emitter of the transistor 132 is electrically coupled to the collector and base of the transistor 133.

The collector and base of the transistor 133 are electrically coupled to each other. This means that the transistor 133 is diode-connected. The emitter of the transistor 133 is electrically coupled to a reference potential.

One end of the capacitor 134 is electrically coupled to the collector and base of the transistor 132. The other end of the capacitor 134 is electrically coupled to the reference potential. The capacitor 134 stabilizes the voltage across the transistors 132 and 133, that is, voltage across two diodes.

The collector of the transistor 135 is electrically coupled to a supply voltage Vbat of a constant level. The base of the transistor 135 is electrically coupled to the one end of the capacitor 134. A constant amount of bias current is inputted to the base of the transistor 135. The emitter of the transistor 135 is coupled to the amplifier circuit 11. The transistor 135 outputs a current Ief_pwr of a constant amount to the amplifier circuit 11.

In FIG. 3, when the dispersion circuit 41 is brought into focus, the dispersion circuit 41 includes a transistor Qd, and resistors Rd_b, Rd_c, and Rd_e. The resistors Rd_b, Rd_c, and Rd_e may be interconnection resistors.

The transistor Qd is a heterojunction bipolar transistor having an emitter and a base creating a heterojunction. The band gap of the emitter is greater than the band gap of the base.

One end of the resistor Rd_b is electrically coupled to the base of the transistor 135 and the one end of the capacitor 134 of the bias circuit 13. The other end of the resistor Rd_b is electrically coupled to the base of the transistor Qd.

One end of the resistor Rd_c is electrically coupled to one end of the inductor 5 in FIG. 2. The supply voltage Vcc, which is an envelope-tracking supply voltage, is inputted to the one end of the resistor Rd_c. The other end of the resistor Rd_c is electrically coupled to the collector of the transistor Qd.

One end of the resistor Rd_e is electrically coupled to the emitter of the transistor Qd. The other end of the resistor Rd_e is electrically coupled to the amplifier circuit 11. It should be noted that the resistor Rd_e can be removed. This means that the emitter of the transistor Qd is electrically coupled to the amplifier circuit 11.

The electric potential at the one end of the resistor Rd_b is determined by the electric potential (constant potential) at the capacitor 134. The electric potential at the one end of the resistor Rd_c is determined by the supply voltage Vcc, which is an envelope-tracking supply voltage. As a result, the operation of the transistor Qd changes in accordance with the supply voltage Vcc.

A bias current Ib is the total of the current Ief_pwr and a current Id_e, that is, Ib=Ief_pwr+Id_e, where the current Ief_pwr is an emitter current of the transistor 135 and the current Id_e is an emitter current of the transistor Qd. Thus, the current Ief_pwr and the current Id_e contribute to adjustment of bias point of a transistor in the amplifier circuit 11.

The dispersion circuit 41 outputs the current Id_e in accordance with the supply voltage Vcc via the resistor Rd_e to the amplifier circuit 11, such that the dispersion circuit 41 controls bias current.

In the present disclosure, the lower limit voltage of the supply voltage Vcc is referred to as a first voltage. The upper limit voltage of the supply voltage Vcc is referred to as a second voltage. The first voltage may be, for example, about 1.0 V, but the present disclosure is not limited to this example. The second voltage may be, for example, about 4.5 V, but the present disclosure is not limited to this example.

The transistor Qd is a heterojunction bipolar transistor. Thus, after the supply voltage Vcc exceeds a third voltage (threshold voltage) higher than the first voltage, the transistor Qd operates in a different manner. The third voltage may be, for example, about 3 V, but the present disclosure is not limited to this example.

When the supply voltage Vcc is within the range higher the third voltage, the transistor Qd operates as an emitter follower circuit. By contrast, when the supply voltage Vcc is within the range equal to or lower than the third voltage, the transistor Qd operates as two p-n junction diodes (p-n junction between base and collector and p-n junction between base and emitter).

In the present disclosure, a first current path denotes a path along which current flows from the bias circuit 13 via the resistor Rb to the base of a transistor Qx in the amplifier circuit 11. The first current path electrically connects the emitter of the transistor 135 and the base of the transistor Qx in the amplifier circuit 11. The emitter of the transistor Qd is electrically coupled to the first current path via the resistor Rd_e.

A second current path denotes a path along which current flows from the bias circuit 13 via the resistor Rd_b, the p-n junction between the base and collector of the transistor Qd, and the resistor Rd_c to a connection point P11. The base of the transistor 135 is coupled to the second current path via the resistor Rd_b.

A third current path denotes a path along which current flows from the connection point P11 via the resistor Rd_c, the collector and emitter of the transistor Qd, the resistor Rd_e, and the resistor Rb to the base of the transistor Qx in the amplifier circuit 11.

Case of Transistor Operating as Emitter Follower Circuit

The following is a description of the case in which the transistor Qd operates as an emitter follower circuit. In this case, the current Ief_pwr flows from the bias circuit 13 via the first current path to the base of the transistor Qx. At the same time, the current Id_e flows from the connection point P11 through the third current path to the base of the transistor Qx. At this time, a current Id_b is negligibly small, and thus, the current Id_e is almost equal to a current Id_c; that is, Id_e≈Id_c.

Case of Transistor Operating as Two p-n Junction Diodes

The following is a description of the case in which the transistor Qd operates as two p-n junction diodes. In this case, current flows from the bias circuit 13 through the second current path to the connection point P11. This is because the on-voltage of the p-n junction between the base and collector of the transistor Qd is lower than the on-voltage of the p-n junction between the base and emitter of the transistor Qd; thus, current flows more easily between the base and collector of the transistor Qd than the base and emitter of the transistor Qd. At this time, the current Id_c flows in a direction opposite to the direction indicated by the arrow in FIG. 3.

In the dispersion circuit 41, the current Id_c increases in the direction (opposite direction) from the bias circuit 13 through the second current path to the connection point P11, as the supply voltage Vcc decreases. In other words, in the dispersion circuit 41, as the supply voltage Vcc decreases, the current Id_b flowing as the current Id_c in the direction (opposite direction) to the connection point P11 along the second current path increases, and as a result, the current flowing in the base of the transistor 135 decreases. This means that, as the supply voltage Vcc decreases, the dispersion circuit 41 decreases the current flowing into the base of the transistor 135. This decreases the current Ief_pwr and consequently decreases the bias current Ib.

Thus, a collector current Icc of the transistor Qx also decreases. As such, when the supply voltage Vcc is within the range equal to or lower than the third voltage, the dispersion circuit 41 can decrease the gain of the transistor Qx. For example, when the supply voltage Vcc is the first voltage, that is, the lower limit voltage, the dispersion circuit 41 can decrease the gain of the transistor Qx from the gain at the time when the transistor Qx outputs the highest power with the maximum efficiency. Accordingly, the dispersion circuit 41 can improve the gain dispersion characteristic of the power amplifier circuit.

Operational Characteristics of Dispersion Circuit

Figure 4:
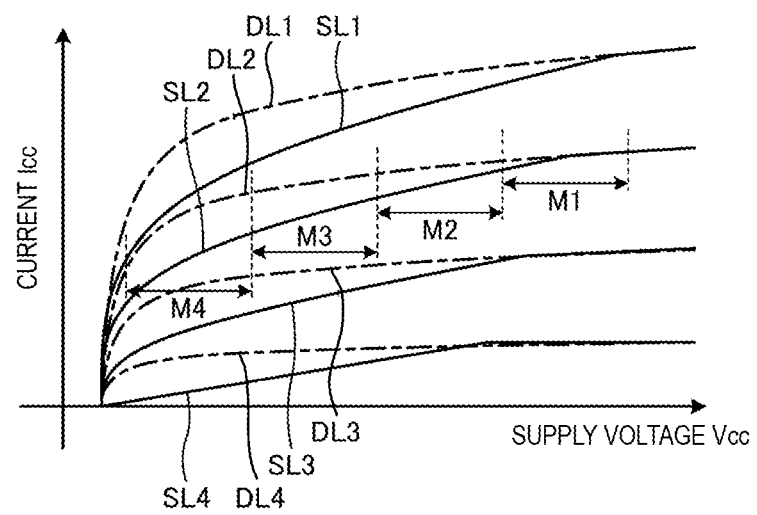
FIG. 4 illustrates an operational characteristic of the dispersion circuit.
Figure 5:
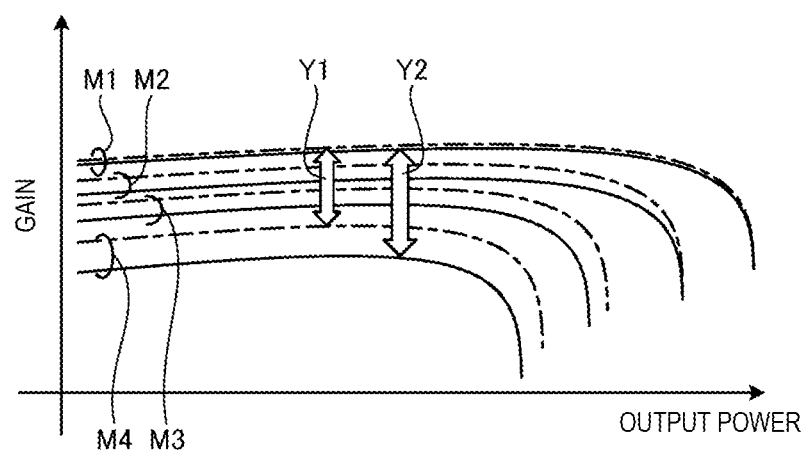
FIG. 5 illustrates an operational characteristic of the dispersion circuit.

FIGS. 4 and 5 illustrate operational characteristics of the dispersion circuit 41. FIG. 4 illustrates a characteristic of the collector current Icc to the supply voltage Vcc with respect to the bias current Ibias. In FIG. 4, the horizontal axis indicates the supply voltage Vcc, and the vertical axis indicates the collector current Icc.

In FIG. 4, dot-dash lines DL1 to DL4 represent operational characteristics in the case without necessarily the dispersion circuit 41, and solid lines SL1 to SL4 represent operational characteristics in the case with the dispersion circuit 41. The dot-dash line DL1 and the solid line SL1 indicate the case with the same bias current Ibias of a relatively large amount. The dot-dash line DL4 and the solid line SL4 indicate the case with the same bias current Ibias of a relatively small amount. As illustrated in FIG. 4, bringing into focus the operational characteristics of the dot-dash lines DL1 to DL4 in the case without necessarily the dispersion circuit 41, when the supply voltage Vcc decreases, the collector current Icc remains at almost the same amount or gradually decreases with respect to the different amounts of the bias current Ibias.

In contrast, bringing into focus the solid lines SL1 to SL4 in the case with the dispersion circuit 41 with respect to the different amounts of the bias current Ibias, while the supply voltage Vcc is relatively high, the solid lines SL1 to SL4 almost coincide with the dot-dash lines DL1 to DL4. This means that, when the supply voltage Vcc is relatively high, the operational characteristics in the case with the dispersion circuit 41 are almost identical to the operational characteristics in the case without necessarily the dispersion circuit 41. When the supply voltage Vcc is relatively low, the dispersion circuit 41 draws current from the bias circuit 13 to decrease the collector current Icc. In this example, as the supply voltage Vcc decreases, the operational characteristics represented by the solid lines SL1 to SL4 linearly decreases with more greatly decreasing collector current Icc than the operational characteristics represented by the dot-dash lines DL1 to DL4. As such, in the case with the dispersion circuit 41, the collector current Icc changes in the range of a relatively lower area in FIG. 4. As described above, as the supply voltage Vcc increases, the amount of current drawn by the dispersion circuit 41 from the bias circuit 13 decreases. Hence, when the supply voltage Vcc is relatively high, the operational characteristics represented by the solid lines SL1 to SL4 are almost identical to the operational characteristics represented by the dot-dash lines DL1 to DL4 as described above. Here, the dot-dash line DL2 and the solid line SL2 are brought into focus. The dot-dash line DL2 and the solid line SL2 can be divided into a plurality of sections, for example, four sections M1, M2, M3, and M4 with respect to the supply voltage Vcc. Among the four sections M1, M2, M3, and M4, the section M1 is a section including a highest supply voltage. Among the four sections M1, M2, M3, and M4, the section M5 is a section including a lowest supply voltage. An example of variations in gain with respect to the sections M1, M2, M3 and M4 of the supply voltage Vcc will be described with reference to FIG. 5. It should be noted that gain increases or decreases in proportion to the collector current Icc.

FIG. 5 illustrates a characteristic of gain to power. In FIG. 5, the horizontal axis indicates output power, and the vertical axis indicates gain. In FIG. 5, dot-dash lines represent operational characteristics in the respective sections M1 to M4 in FIG. 4 in the case without necessarily the dispersion circuit 41. In FIG. 5, solid lines represent operational characteristics in the case with the dispersion circuit 41.

As illustrated in FIG. 5, in the case without necessarily the dispersion circuit 41, the operational characteristics corresponding to the sections M1 to M4 in FIG. 4 represented by the dot-dash lines indicate that, while power is relatively high, gain steeply decreases. In the case without necessarily the dispersion circuit 41, gain varies in the range indicated by an arrow Y1 among the operational characteristics corresponding to the sections M1 to M4.

By contrast, in the case with the dispersion circuit 41, the operational characteristics corresponding to the sections M1 to M4 in FIG. 4 indicate that gain decreases, as represented by the solid lines. In particular, the operational characteristic corresponding to the section M4 in FIG. 4 indicates the largest decrease in gain. In the case with the dispersion circuit 41, gain varies in the range indicated by an arrow Y2 among the operational characteristics corresponding to the sections M1 to M4. This means that, in the case with the dispersion circuit 41, gain varies in a wider range as indicated by the arrow Y2. As such, coupling the dispersion circuit 41 to the bias circuit 13 can widen the range of variations in gain. The other lines in FIG. 4, namely the solid line SL1 and the dot-dash line DL1, the solid line SL3 and the dot-dash line DL3, and the solid line SL4 and the dot-dash line DL4, can also be divided into a plurality of sections in the same manner. Coupling the dispersion circuit 41 to the bias circuit 13 can also widen the range of variations in gain among the operational characteristics corresponding to the respective sections as illustrated in FIG. 5.

In the power amplifier circuit 100a according to the first comparative example illustrated in FIG. 2, the dispersion circuit 41 is coupled to the amplifier circuit 11. Thus, when the amplifier circuit 11 is a differential amplifier circuit, a difference in the interconnection length yields an asymmetrical arrangement, and as a result, the differential amplifier circuit cannot achieve symmetry.

Second Comparative Example

Figure 6:
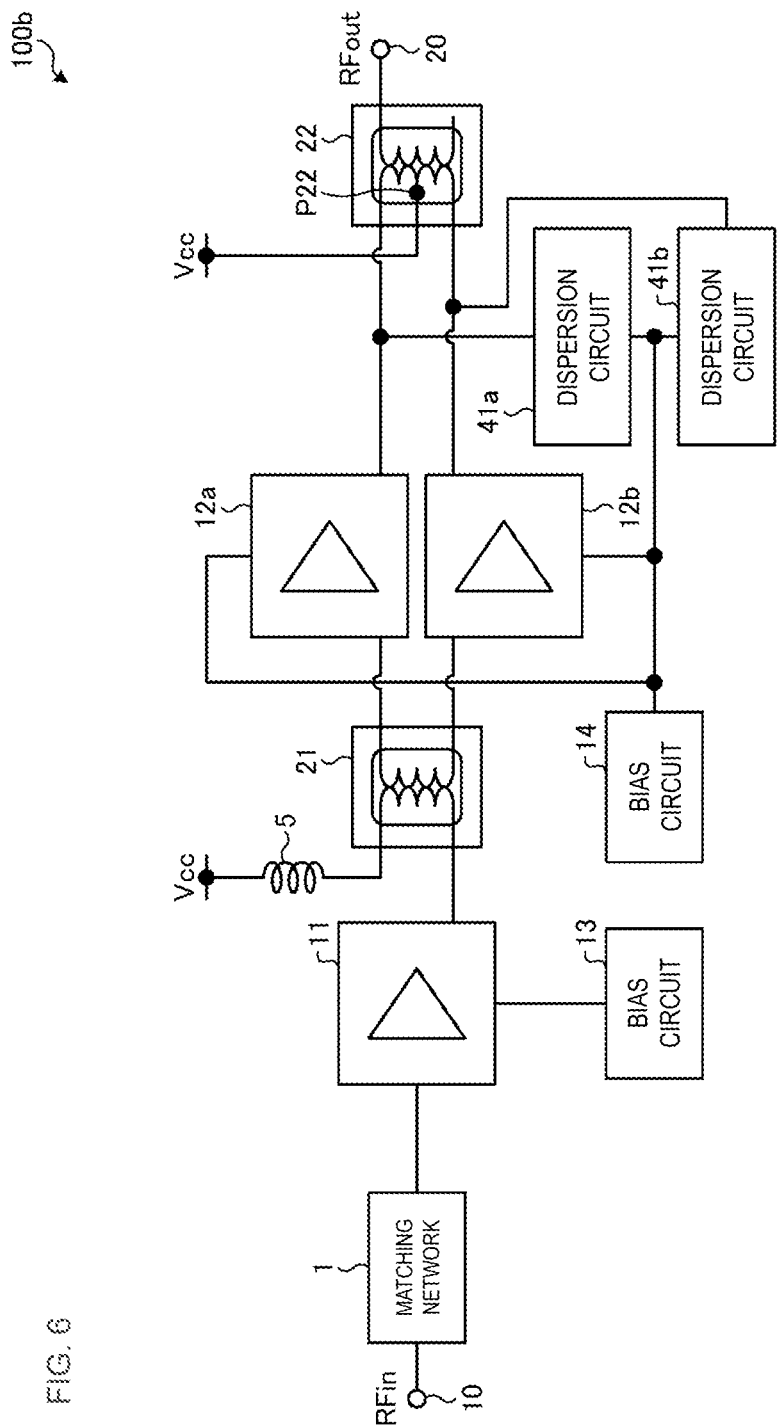
FIG. 6 illustrates a power amplifier circuit of a second comparative example.

FIG. 6 illustrates a power amplifier circuit of a second comparative example. As illustrated in FIG. 6, a power amplifier circuit 100b of the second comparative example includes amplifier circuits 12a and 12b. The amplifier circuits 12a and 12b form a differential amplifier circuit.

A transformer 21 is provided between the amplifier circuit 11 in the first stage and the amplifier circuits 12a and 12b. A primary winding and a secondary winding of the transformer 21 are coupled via an electromagnetic field, and as a result, a signal is transferred from the primary winding to the secondary winding. One end of the primary winding of the transformer 21 is coupled to the supply voltage Vcc via the inductor 5. The transformer 21 operates as a matching network.

A transformer 22 is provided on the output side with respect to the amplifier circuits 12a and 12b. A primary winding and a secondary winding of the transformer 22 are coupled via an electromagnetic field, and as a result, a signal is transferred from the primary winding to the secondary winding. One end of the primary winding of the transformer 22 is coupled to an output of the amplifier circuit 12a. The other end of the primary winding of the transformer 22 is coupled to an output of the amplifier circuit 12b.

A midpoint P22 of the primary winding of the transformer 22 is coupled to the supply voltage Vcc. The transformer 22 operates as a matching network. The midpoint in the present disclosure does not mean a position at which the inductance is half the inductance of the primary winding of the transformer 22; the midpoint in the present disclosure is defined as a point that is half of the primary winding of the transformer 22 with consideration of manufacturing variations of the primary winding of the transformer 22.

The bias circuit 14 is coupled to the amplifier circuits 12a and 12b. The bias circuit 14 supplies a bias current to the amplifier circuits 12a and 12b.

A dispersion circuit 41a is coupled on an output side of the amplifier circuit 12a. A dispersion circuit 41b is coupled on an output side of the amplifier circuit 12b. The dispersion circuits 41a and 41b adjust a bias current supplied by the bias circuit 14 to the amplifier circuits 12a and 12b.

In the power amplifier circuit 100b of the second comparative example illustrated in FIG. 6, the dispersion circuit 41a is coupled to the amplifier circuit 12a, and the dispersion circuit 41b is coupled to the amplifier circuit 12b. Thus, the symmetry of the differential amplifier circuit formed by the amplifier circuits 12a and 12b may be insufficient due to, for example, the interconnection length.

There are two cases for use of the dispersion circuit: the dispersion circuit is used for a power supply of a first-stage amplifier circuit with a lower level of amplitude of radio-frequency signal; and the dispersion circuit is used for a power supply of a second-stage amplifier circuit. In some systems, only the second-stage amplifier circuit operates by envelope tracking. In this case, the amplitude of radio-frequency signal of the second-stage output may leak into the bias circuit, which may cause malfunction. Since a great demand exists for high power performance in recent years, the problem described above has become considerable.

To achieve high power performance, a differential amplifier circuit may be used in some cases. Symmetry is suitable to design a differential amplifier circuit. Here, the symmetry of a differential amplifier circuit denotes that gain or loss is the same between the positive side (+ side) and negative side (− side) of the differential amplifier circuit; the phase difference between the positive side (+ side) and negative side (− side) of the differential amplifier circuit is 180 degrees without necessarily any phase gap; and the impedance of a bias circuit on the positive side (+ side) of the differential amplifier circuit is the same as the impedance of a bias circuit on the negative side (− side) of the differential amplifier circuit. To achieve this symmetry, for example, a plurality of dispersion circuits are symmetrically coupled. However, the circuit size may increase in this case.

Second Embodiment

Figure 7:
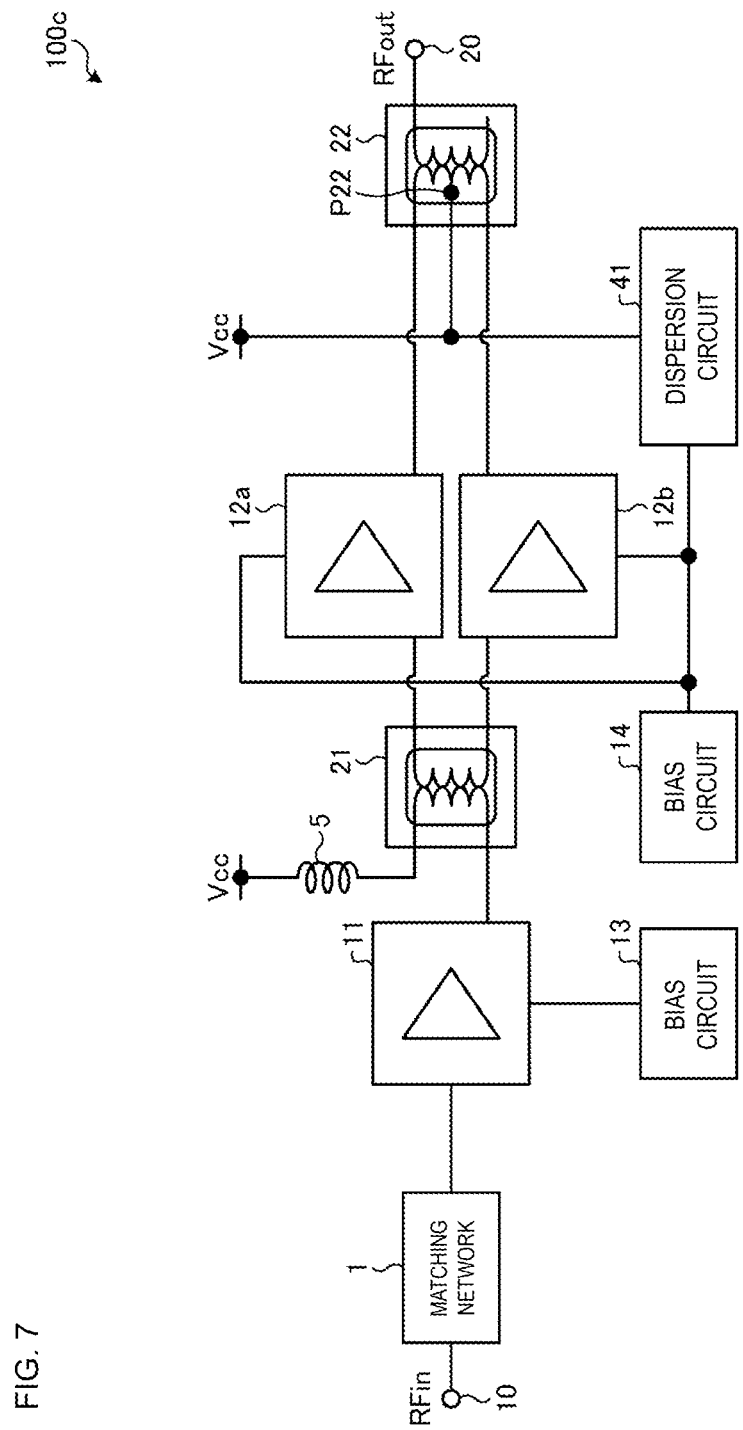
FIG. 7 illustrates a power amplifier circuit according to a second embodiment.

FIG. 7 illustrates a power amplifier circuit according to the second embodiment.

Configuration

As illustrated in FIG. 7, a power amplifier circuit 100c according to the second embodiment includes the amplifier circuits 12a and 12b, similarly to the power amplifier circuit 100b illustrated in FIG. 6. The amplifier circuits 12a and 12b form a differential amplifier circuit. A single dispersion circuit 41 is coupled on the output side of the amplifier circuit 12a. The dispersion circuit 41 controls a bias supplied by the bias circuit 14 to the amplifier circuits 12a and 12b. The other configuration of the power amplifier circuit 100c is the same as the power amplifier circuit 100b according to the first comparative example described with reference to FIG. 6.

It should be noted that, although the power amplifier circuit 100c includes amplifier circuits in two stages, which are the amplifier circuit 11 and the amplifier circuits 12a and 12b, the present disclosure is not limited to this example. The power amplifier circuit 100c may include, for example, an amplifier circuit in a single stage or amplifier circuits in three or more stages. For example, the power amplifier circuit 100c may further include one or more amplifier circuits inserted between the amplifier circuit 11 and the amplifier circuits 12a and 12b. For example, the power amplifier circuit 100c may include only the amplifier circuits 12a and 12b without necessarily the amplifier circuit 11.

Operation

The radio-frequency input signal RFin inputted from the input terminal 10 is inputted to the amplifier circuit 11 via the matching network 1. The amplifier circuit 11 amplifies the inputted signal and output the amplified signal. The amplifier circuit 11 outputs a single-ended signal. The output signal from the amplifier circuit 11 is inputted to one end of the primary winding of the transformer 21.

The signal from the secondary winding of the transformer 21 is inputted to the amplifier circuit 12. The amplifier circuits 12a and 12b amplify the signal inputted through the transformer 21. The amplifier circuits 12a and 12b output the amplified signal as a pair of differential signals. The pair of differential signals outputted by the amplifier circuits 12a and 12b are inputted to the primary winding of the transformer 22. Consequently, the radio-frequency output signal RFout, which is a single-ended signal, is outputted from the secondary winding of the transformer 22 to the output terminal 20.

The bias circuit 13 supplies a bias (that is, a bias current or bias voltage) to the base or gate of the amplifier circuit 11. The bias circuit 14 supplies a bias (that is, a bias current or bias voltage) to the amplifier circuits 12a and 12b. In accordance with the signal outputted by the amplifier circuit 12a, the dispersion circuit 41 controls the bias to be supplied to the amplifier circuits 12a and 12b. As a result, the bias controlled by the dispersion circuit 41 is supplied to the amplifier circuits 12a and 12b.

The dispersion circuit 41 is coupled to a center tap, that is, the midpoint P22 of the primary winding of the transformer 22. The midpoint P22 is a virtual ground point of radio-frequency signal. This means that the dispersion circuit 41 does not affect the symmetry of the differential amplifier circuit formed by the amplifier circuits 12a and 12b. Thus, when the amplitude of radio-frequency signal greatly fluctuates, it is possible to properly operate the differential amplifier circuit formed by the amplifier circuits 12a and 12b. For this reason, interconnections can be unsymmetrical. Because the dispersion circuit 41 is coupled to the virtual ground point, radio-frequency signals at odd-order frequencies cancel each other out, and as a result, the symmetry of the differential amplifier circuit is not affected.

Because the dispersion circuit 41 is coupled to the midpoint P22, the dispersion circuit 41 can be isolated from radio-frequency signals, and consequently, it is possible to reduce the resistance of the dispersion circuit 41. By decreasing the resistance of the dispersion circuit 41, the solid lines SL1 to SL4 described with reference to FIG. 4 can be inclined at larger angles, and as a result, the range of variations in gain can be widened (refer to FIG. 5).

Usually, when a dispersion circuit is coupled on the output side with respect to an amplification stage or coupled to a line for radio-frequency signals, the dispersion circuit needs to have a resistance in the order of several thousands of Q to achieve isolation. By contrast, when the dispersion circuit is coupled to the midpoint of a transformer as in the present disclosure, the dispersion circuit achieves isolation. As a result, the resistance can be reduced to the order of several hundreds of Q, such that the solid lines SL1 to SL4 described with reference to FIG. 4 are inclined at larger angles.

Specific Configuration Example

Figure 8:
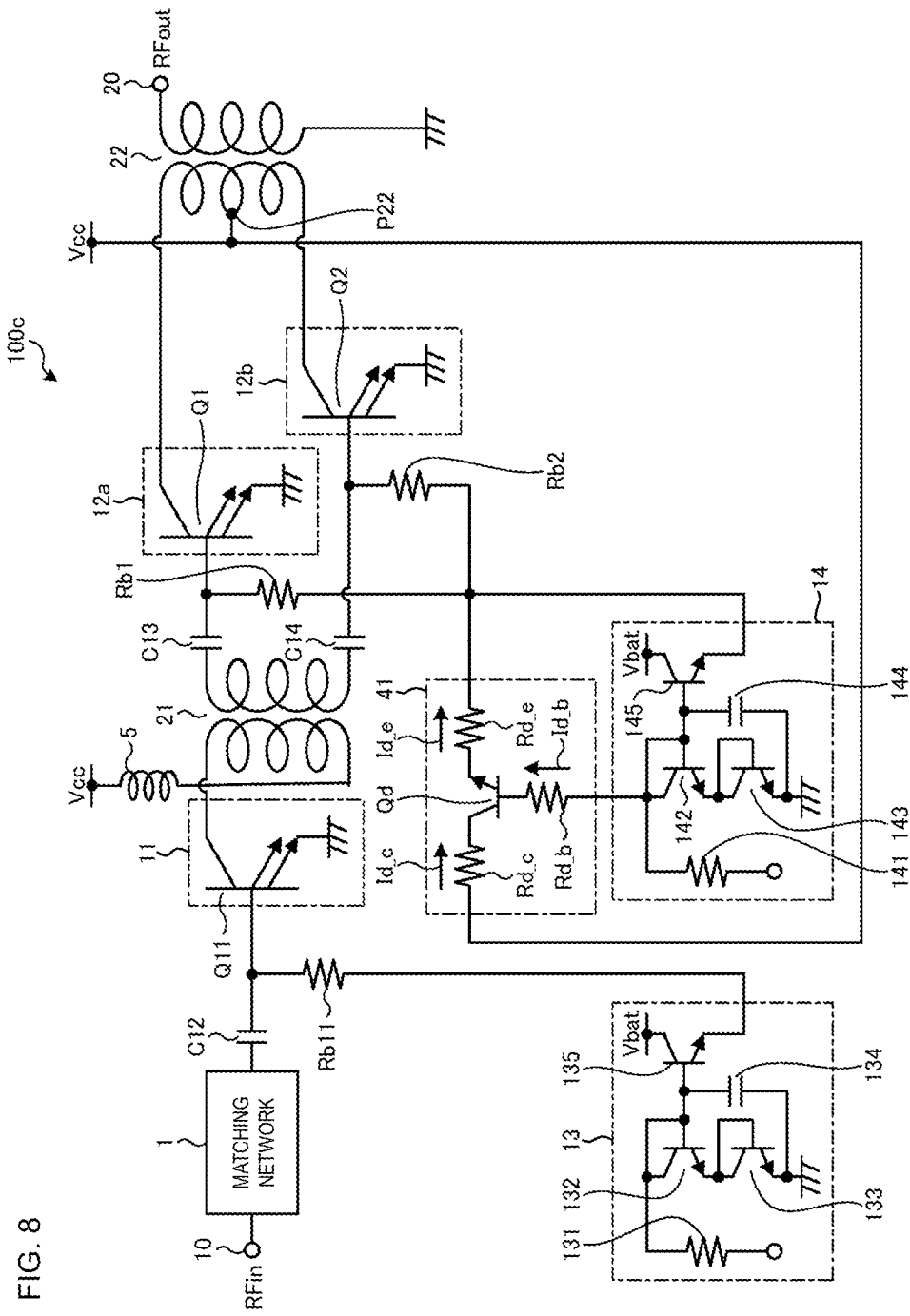
FIG. 8 illustrates a more specific configuration example of the power amplifier circuit according to the second embodiment.

FIG. 8 illustrates a more specific configuration example of the power amplifier circuit 100c according to the second embodiment. As illustrated in FIG. 8, the input terminal 10 is coupled to the matching network 1. A capacitor C12 is provided between the matching network 1 and the amplifier circuit 11. The bias circuit 13 is coupled to the input side of the amplifier circuit 11 via a resistor Rb11. The amplifier circuit 11 includes a transistor Q11.

The output side of the amplifier circuit 11 is coupled to the primary winding of the transformer 21. The secondary winding of the transformer 21 is coupled to the amplifier circuits 12a and 12b via capacitors C13 and C14. The amplifier circuit 12a includes a transistor Q1. The amplifier circuit 12b includes a transistor Q2. The output side of the amplifier circuits 12a and 12b is coupled to the primary winding of the transformer 22. The secondary winding of the transformer 22 is coupled to the output terminal 20.

The bias circuit 14 is coupled to an input side of the amplifier circuit 12a via a resistor Rb1. An input side of the amplifier circuit 12b is coupled to the bias circuit 14 via a resistor Rb2. The bias circuit 14 is configured in the same manner as the bias circuit 13 described with reference to FIG. 3. Specifically, the bias circuit 14 includes a resistor 141, transistors 142, 143, and 145, and a capacitor 144. The bias circuit 14 operates in the same manner as the bias circuit 13 in FIG. 3. The dispersion circuit 41 is coupled to the bias circuit 14. The dispersion circuit 41 controls a bias supplied by the bias circuit 14 to the amplifier circuits 12a and 12b, similarly to the bias circuit 13 described with reference to FIG. 3.

The dispersion circuit 41 is coupled to the center tap, that is, the midpoint P22 of the primary winding of the transformer 22. Because the dispersion circuit 41 is coupled to the midpoint P22, the dispersion circuit 41 does not affect the symmetry of the differential amplifier circuit formed by the amplifier circuits 12a and 12b. Instead of providing dispersion circuits for the respective amplifier circuits 12a and 12b, the single dispersion circuit 41 is provided. As such, the dispersion circuit can be one circuit without necessarily destroying the symmetry of the differential amplifier circuit formed by the amplifier circuits 12a and 12b, and as a result, the circuit size can be reduced.

Unlike a choke coil provided in a power supply circuit, decoupling capacitance is optional for the midpoint P22 of the transformer 22.

Third Embodiment

Figure 9:
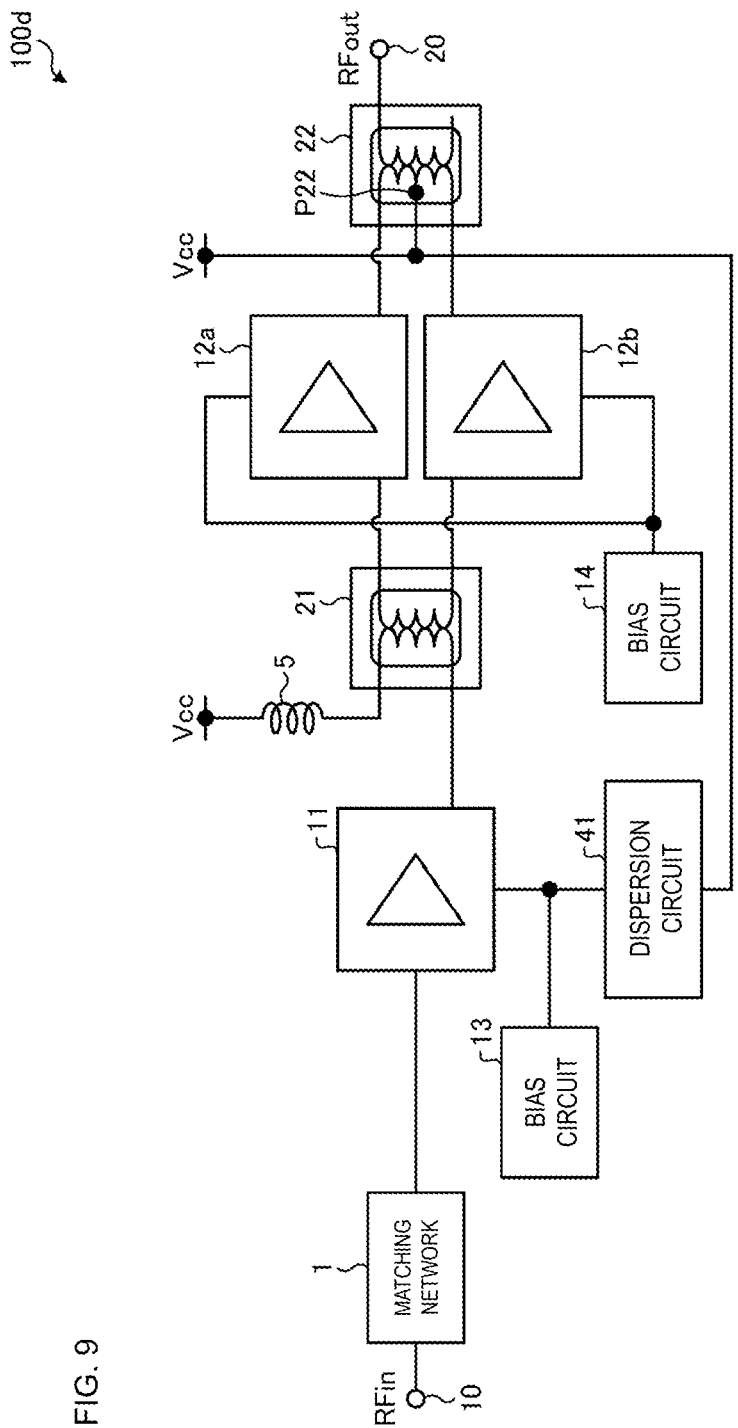
FIG. 9 illustrates a power amplifier circuit according to a third embodiment.

FIG. 9 illustrates a power amplifier circuit according to a third embodiment. As illustrated in FIG. 9, a power amplifier circuit 100d according to the third embodiment includes the dispersion circuit 41 coupled to the center tap, that is, the midpoint P22 of the primary winding of the transformer 22, similarly to the power amplifier circuit 100c in FIG. 7. However, unlike the power amplifier circuit 100c in FIG. 7, the dispersion circuit 41 adjusts a bias current supplied by the bias circuit 13 to the amplifier circuit 11 in the first stage. The midpoint P22 is a virtual ground point of radio-frequency signal. Because the dispersion circuit 41 is coupled to the midpoint P22, the dispersion circuit 41 does not affect the symmetry of the differential amplifier circuit formed by the amplifier circuits 12a and 12b.

Fourth Embodiment

Figure 10:
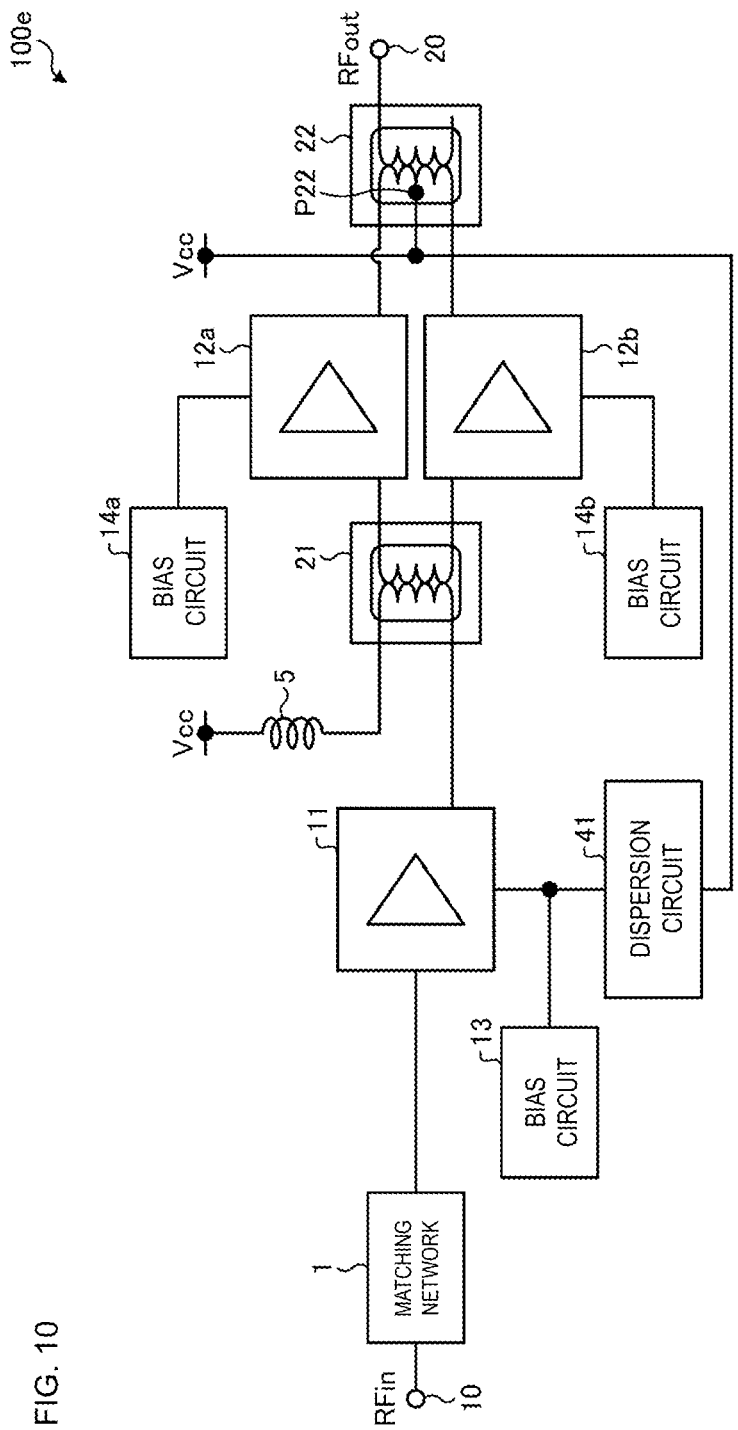
FIG. 10 illustrates a power amplifier circuit according to a fourth embodiment.

FIG. 10 illustrates a power amplifier circuit according to a fourth embodiment. As illustrated in FIG. 10, in the power amplifier circuit 100e according to the fourth embodiment, bias circuits 14a and 14b are coupled to the amplifier circuits 12a and 12b, unlike the power amplifier circuit 100d in FIG. 9. The bias circuit 14a supplies a bias current to the amplifier circuit 12a. The bias circuit 14b supplies a bias current to the amplifier circuit 12b.

In the power amplifier circuit 100e according to the fourth embodiment, in the same manner as the power amplifier circuit 100d in FIG. 9, the dispersion circuit 41 is coupled to the center tap, that is, the midpoint P22 of the primary winding of the transformer 22. The midpoint P22 is a virtual ground point of radio-frequency signal. Because the dispersion circuit 41 is coupled to the midpoint P22, the dispersion circuit 41 does not affect the symmetry of the differential amplifier circuit formed by the amplifier circuits 12a and 12b.

Fifth Embodiment

Figure 11:
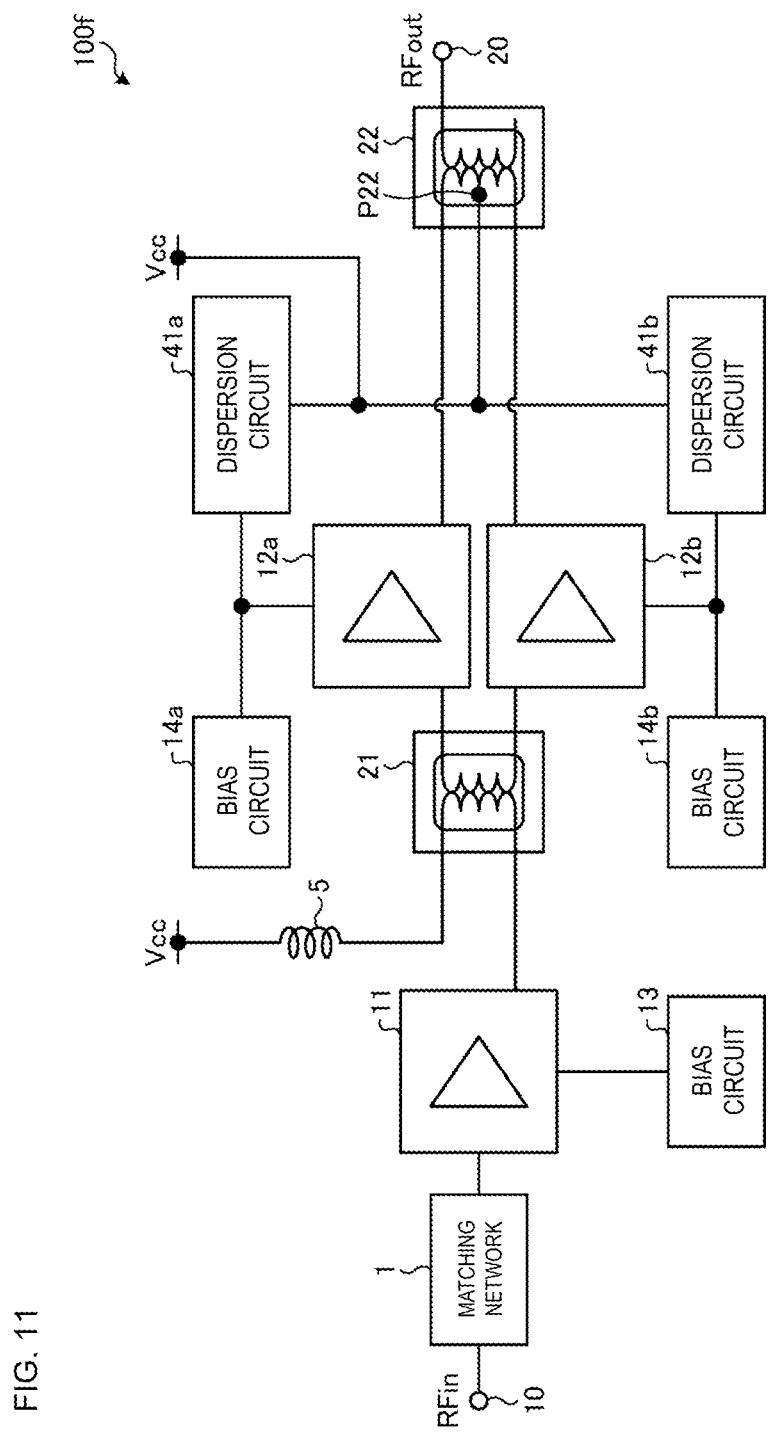
FIG. 11 illustrates a power amplifier circuit according to a fifth embodiment.

FIG. 11 illustrates a power amplifier circuit according to a fifth embodiment. As illustrated in FIG. 11, in the power amplifier circuit 100f according to the fifth embodiment, the dispersion circuit 41a is coupled to the bias circuit 14a corresponding to the amplifier circuit 12a, and the dispersion circuit 41b is coupled to the bias circuit 14b corresponding to the amplifier circuit 12b, unlike the power amplifier circuit 100e in FIG. 10. The dispersion circuit 41a adjusts a bias current to be supplied to the amplifier circuit 12a. The dispersion circuit 41b adjusts a bias current to be supplied to the amplifier circuit 12b.

In the power amplifier circuit 100f according to the fifth embodiment, in the same manner as the power amplifier circuit 100d in FIG. 9, the dispersion circuits 41a and 41b are coupled to the center tap, that is, the midpoint P22 of the primary winding of the transformer 22. The midpoint P22 is a virtual ground point of radio-frequency signal. Because the dispersion circuits 41a and 41b are coupled to the midpoint P22, the dispersion circuits 41a and 41b do not affect the symmetry of the differential amplifier circuit formed by the amplifier circuits 12a and 12b.

Example of Arrangement at Substrate

Figure 12:
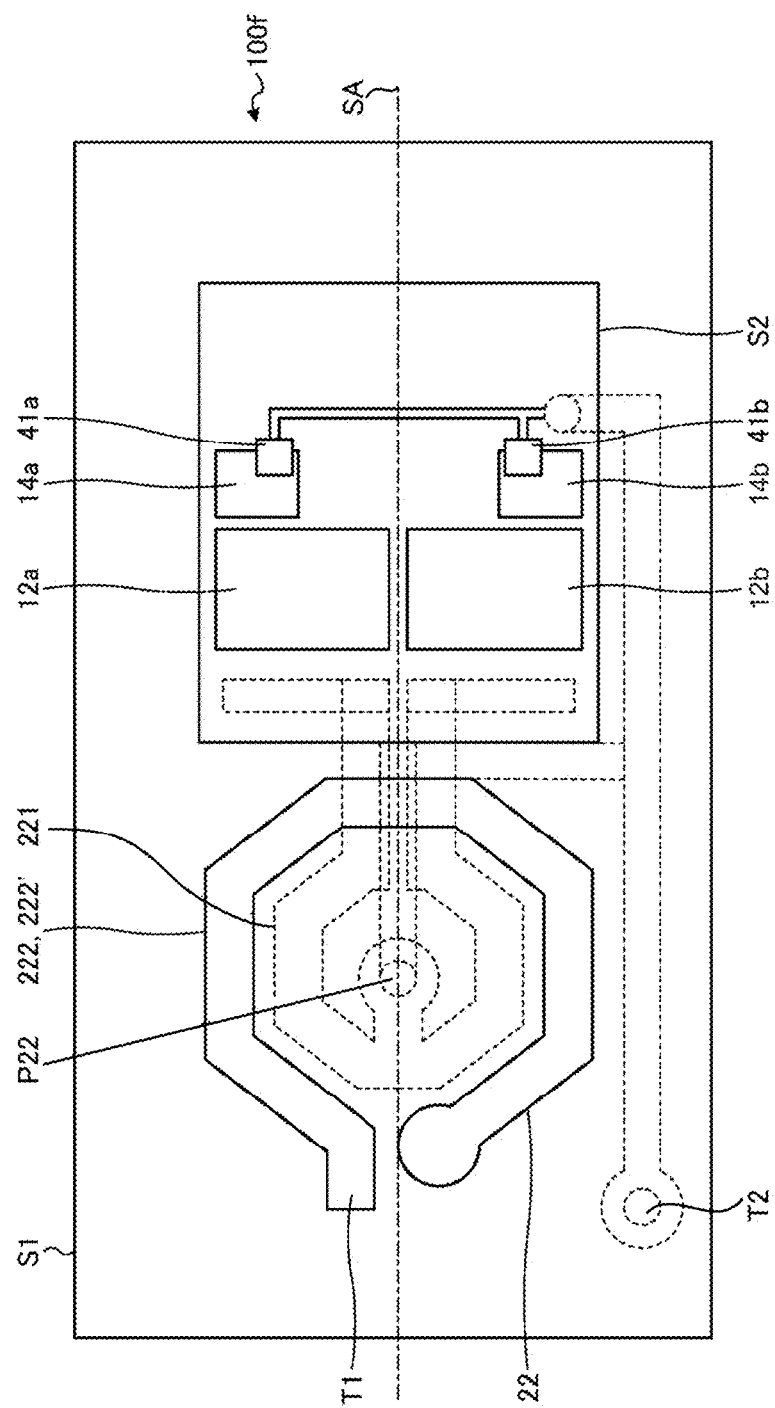
FIG. 12 illustrates an example of an arrangement at a substrate of the power amplifier circuit according to the fifth embodiment.
Figure 13:
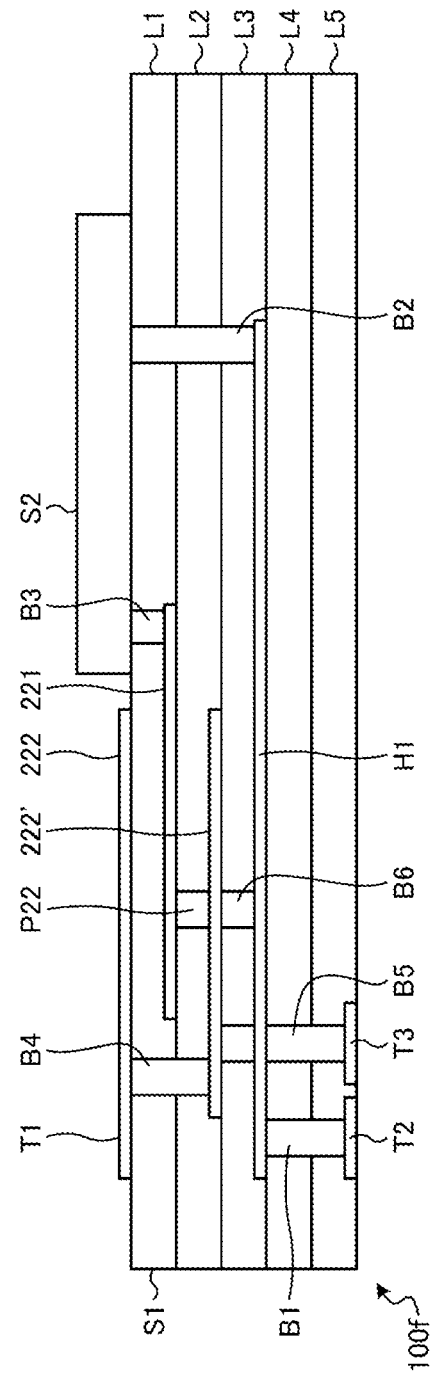
FIG. 13 illustrates an example of an arrangement at a substrate of the power amplifier circuit according to the fifth embodiment.

FIGS. 12 and 13 illustrate an example of an arrangement at a substrate of the power amplifier circuit 100f. FIG. 12 illustrates an upper surface of the substrate. FIG. 13 illustrates a section of the substrate.

As illustrated in FIGS. 12 and 13, a chip S2 is disposed on a substrate S1. The amplifier circuits 12a and 12b, the bias circuits 14a and 14b, and the dispersion circuits 41a and 41b are provided at the chip S2. The transformer 22 formed by wiring patterns 221, 222, and 222' is provided adjacent to the chip S2 at the substrate S1. The amplifier circuit 11 and the bias circuit 13, which are not illustrated in the drawing, are disposed in the chip S2. In this embodiment, the chip S2 is mounted at the substrate S1 by flip chip mounting, but the chip S2 may be mounted at the substrate S1 by wire bonding.

In this embodiment, for example, the substrate S1 has five layers L1 to L5. The layers L1 to L5 are resin layers. For example, conductive wiring patterns are formed at the upper or lower side of the layers L1 to L5. The chip S2 is disposed on the layer L1. A terminal T1 is provided at the layer L1.

The terminal T1 corresponds to the output terminal 20. Terminals T2 and T3 are provided at the layer L5 in FIG. 13. The supply voltage Vcc is applied to the terminal T2. The reference potential is applied to the terminal T3.

The terminal T2 is coupled to an inner wiring pattern H1 via a via B1. A via B2 is coupled to the inner wiring pattern H1. The supply voltage Vcc is supplied to the dispersion circuits 41a and 41b at the chip S2 through the via B1, the inner wiring pattern H1, and the via B2.

The wiring pattern 222 is provided on the layer L1. The wiring pattern 222' is provided on the layer L3. The wiring pattern 221 is provided on the layer L2. The wiring pattern 221 is coupled to the chip S2 via a via B3. The wiring pattern 221 corresponds to the primary winding of the transformer 22. The wiring patterns 222 and 222' are electrically coupled to each other via a via B4. The wiring pattern 222' is coupled to the terminal T3 via a via B5. The wiring patterns 222 and 222' correspond to the secondary winding of the transformer 22.

As described above, the transformer 22 is formed by a plurality of layers; the wiring pattern 221 corresponding to the primary winding and the wiring patterns 222 and 222' corresponding to the secondary winding are formed at different layers. The wiring pattern 221 corresponding to the primary winding and the wiring patterns 222 and 222' corresponding to the secondary winding are coupled via an electromagnetic field. The transformers 21 and 22 in the other embodiments are also formed in the same manner.

The wiring pattern 221 is coupled to the inner wiring pattern H1 via a via B6. The via B6 corresponds to the center tap, that is, the midpoint P22 of the transformer 22. This means that the dispersion circuits 41a and 41b are coupled to the midpoint P22 of the transformer 22.

The midpoint P22 of the transformer 22 is a virtual ground point of radio-frequency signal. Because the dispersion circuits 41a and 41b are coupled to the midpoint P22, the dispersion circuits 41a and 41b do not affect the symmetry of the differential amplifier circuit formed by the amplifier circuits 12a and 12b.

In FIG. 12, when the arrangement of the dispersion circuits 41a and 41b is brought into focus, at the chip S2, the dispersion circuits 41a and 41b are not arranged in a symmetrical manner. Specifically, the interconnection length from the terminal T2, to which the supply voltage Vcc is applied, to the dispersion circuit 41a is different from the interconnection length from the terminal T2 to the dispersion circuit 41b. Although the interconnections are unsymmetrical as described above, because the dispersion circuits 41a and 41b are coupled to the midpoint P22, the dispersion circuits 41a and 41b do not affect the symmetrical operation of the differential amplifier circuit formed by the amplifier circuits 12a and 12b.

Sixth Embodiment

Figure 14:
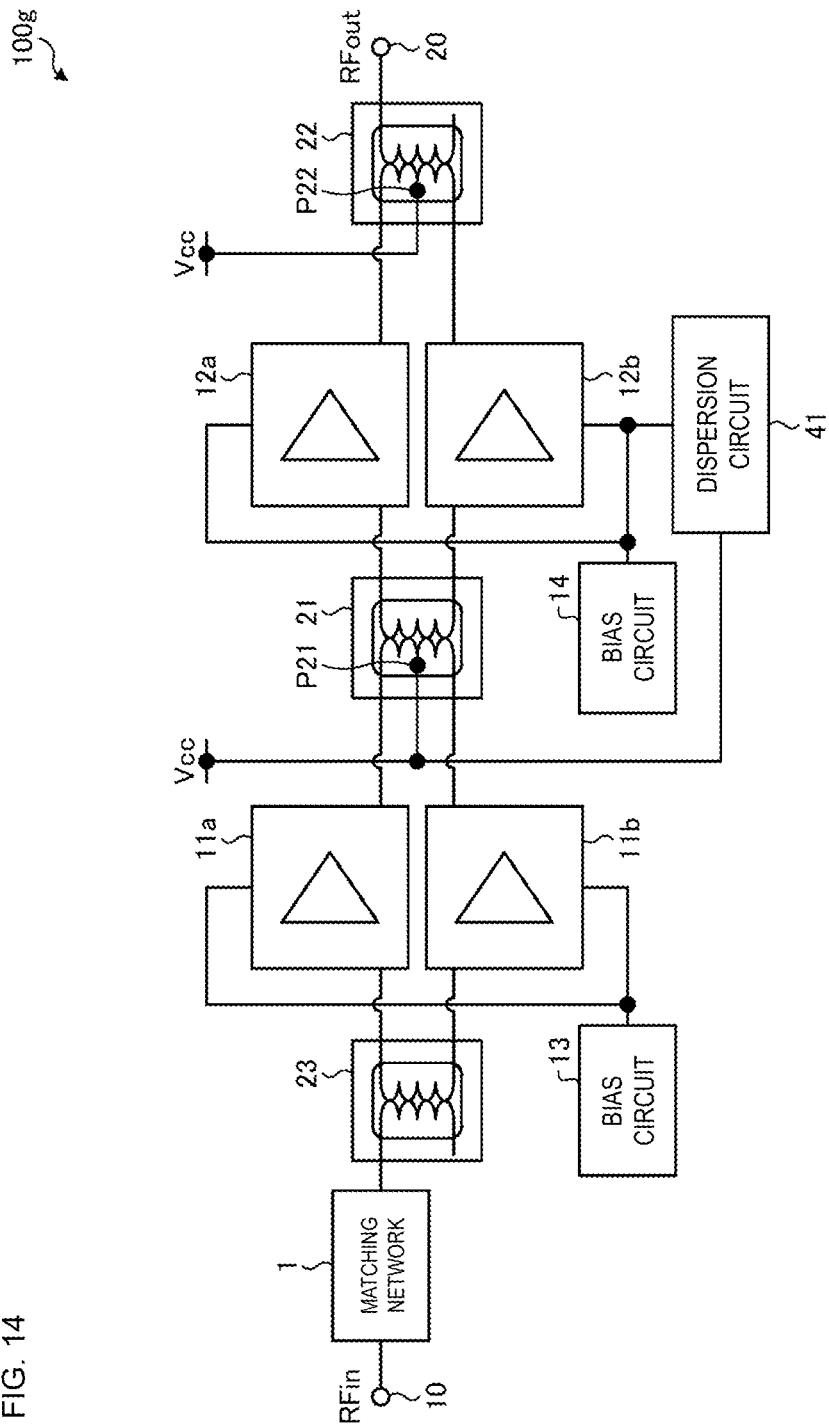
FIG. 14 illustrates a power amplifier circuit according to a sixth embodiment.

FIG. 14 illustrates a power amplifier circuit according to a sixth embodiment. As illustrated in FIG. 14, a power amplifier circuit 100g according to the sixth embodiment includes amplifier circuits 11a and 11b. These first-stage amplifier circuits 11a and 11b form a differential amplifier circuit. This means that the power amplifier circuit 100g includes a first differential amplifier circuit (the amplifier circuits 11a and 11b) and a second differential amplifier circuit (the amplifier circuits 12a and 12b) that are cascade-connected, and the transformer 21 is provided between the first differential amplifier circuit (the amplifier circuits 11a and 11b) and the second differential amplifier circuit (the amplifier circuits 12a and 12b).

The power amplifier circuit 100g according to the sixth embodiment includes the dispersion circuit 41 coupled to the bias circuit 14 corresponding to the amplifier circuits 12a and 12b. The dispersion circuit 41 adjusts a bias current to be supplied to the amplifier circuits 12a and 12b.

In the power amplifier circuit 100g according to the sixth embodiment, the dispersion circuit 41 is coupled to a center tap, that is, a midpoint P21 of the primary winding of the transformer 21. The midpoint P21 is a virtual ground point of radio-frequency signal. Because the dispersion circuit 41 is coupled to the midpoint P21, the dispersion circuit 41 does not affect the symmetry of the differential amplifier circuit formed by the amplifier circuits 11a and 11b.

Seventh Embodiment

Figure 15:
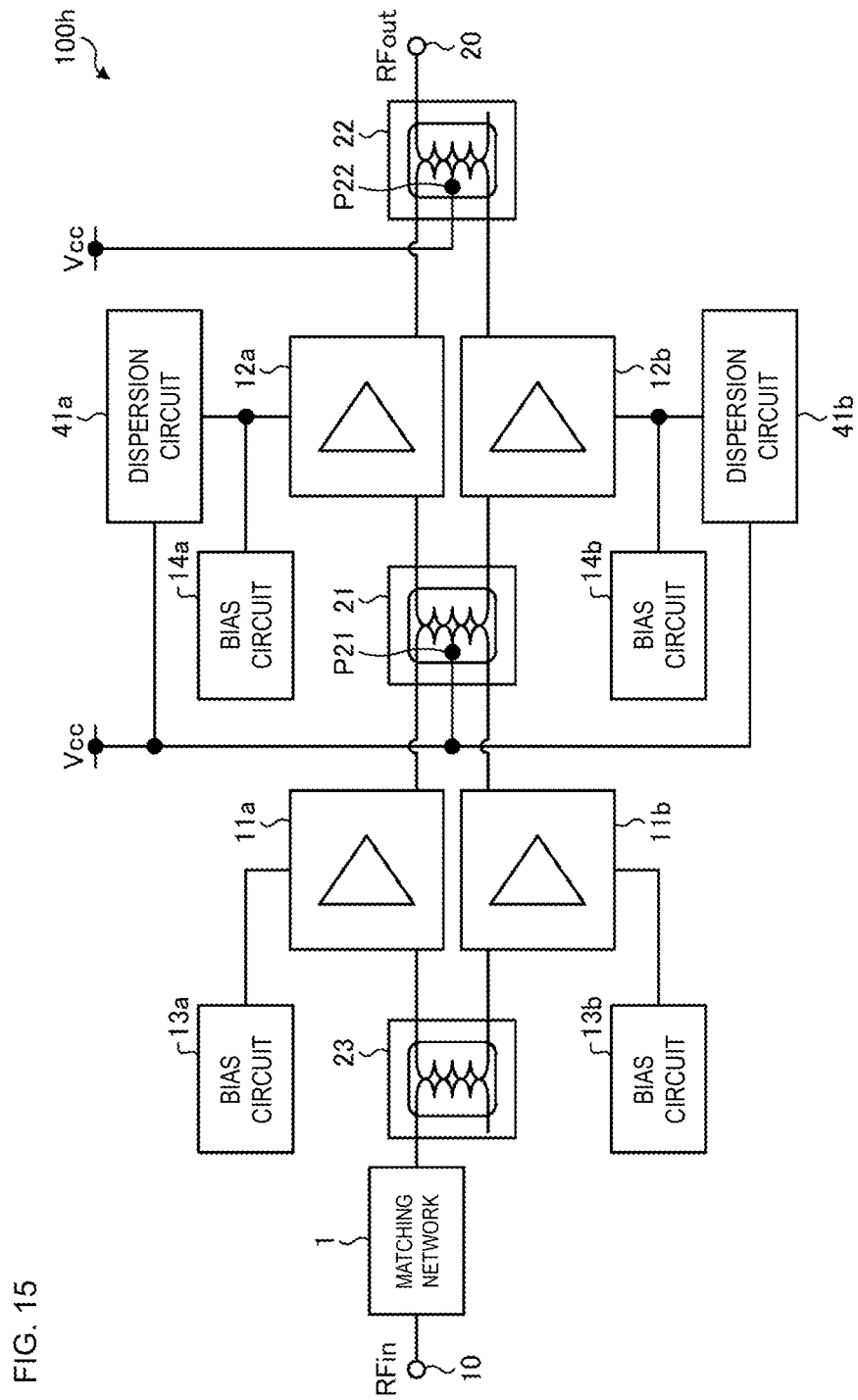
FIG. 15 illustrates a power amplifier circuit according to a seventh embodiment.

FIG. 15 illustrates a power amplifier circuit according to a seventh embodiment. As illustrated in FIG. 15, a power amplifier circuit 100h according to the seventh embodiment includes the amplifier circuits 11a and 11b forming a differential amplifier circuit, similarly to the power amplifier circuit 100g in FIG. 14. This means that the power amplifier circuit 100h includes the first differential amplifier circuit (the amplifier circuits 11a and 11b) and the second differential amplifier circuit (the amplifier circuits 12a and 12b) that are cascade-connected, and the transformer 21 is provided between the first differential amplifier circuit (the amplifier circuits 11a and 11b) and the second differential amplifier circuit (the amplifier circuits 12a and 12b).

In the power amplifier circuit 100h according to the seventh embodiment, the dispersion circuit 41a is coupled to the bias circuit 14a corresponding to the amplifier circuit 12a, and the dispersion circuit 41b is coupled to the bias circuit 14b corresponding to the amplifier circuit 12b, similarly to the power amplifier circuit 100f in FIG. 11. The dispersion circuit 41a adjusts a bias current to be supplied to the amplifier circuit 12a. The dispersion circuit 41b adjusts a bias current to be supplied to the amplifier circuit 12b.

In the power amplifier circuit 100h according to the seventh embodiment, the dispersion circuits 41a and 41b are coupled to the center tap, that is, the midpoint P21 of the primary winding of the transformer 21. Because the dispersion circuits 41a and 41b are coupled to the midpoint P21, the dispersion circuits 41a and 41b do not affect the symmetry of the differential amplifier circuit formed by the amplifier circuits 11a and 11b.

Eighth Embodiment

Figure 16:
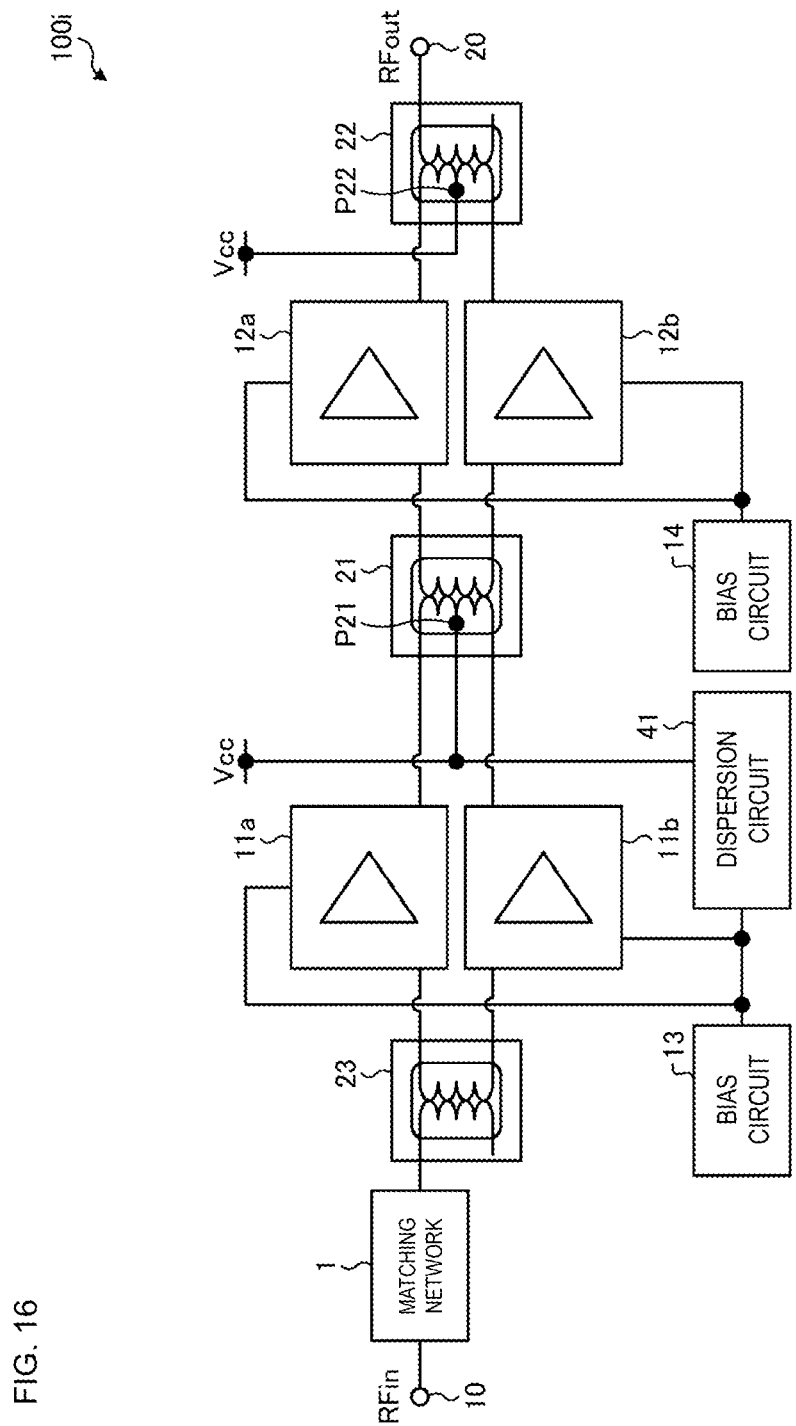
FIG. 16 illustrates a power amplifier circuit according to an eighth embodiment.

FIG. 16 illustrates a power amplifier circuit according to an eighth embodiment. As illustrated in FIG. 16, a power amplifier circuit 100i according to the eighth embodiment includes the amplifier circuits 11a and 11b forming a differential amplifier circuit, similarly to the power amplifier circuit 100g in FIG. 14. This means that the power amplifier circuit 100g includes the first differential amplifier circuit (the amplifier circuits 11a and 11b) and the second differential amplifier circuit (the amplifier circuits 12a and 12b) that are cascade-connected, and the transformer 21 is provided between the first differential amplifier circuit (the amplifier circuits 11a and 11b) and the second differential amplifier circuit (the amplifier circuits 12a and 12b).

The power amplifier circuit 100i according to the eighth embodiment includes the dispersion circuit 41 coupled to the bias circuit 13 corresponding to the amplifier circuits 11a and 11b. The dispersion circuit 41 adjusts a bias current to be supplied to the amplifier circuits 11a and 11b.

In the power amplifier circuit 100i according to the eighth embodiment, the dispersion circuit 41 is coupled to a center tap, that is, a midpoint P21 of the primary winding of the transformer 21. The midpoint P21 is a virtual ground point of radio-frequency signal. Because the dispersion circuit 41 is coupled to the midpoint P21, the dispersion circuit 41 does not affect the symmetry of the differential amplifier circuit formed by the amplifier circuits 11a and 11b. Because the dispersion circuit 41 is shared by the amplifier circuits 11a and 11b, the total circuit size can be reduced in comparison to the case in which the dispersion circuit 41 is provided for each of the amplifier circuits 11a and 11b.

Ninth Embodiment

Figure 17:
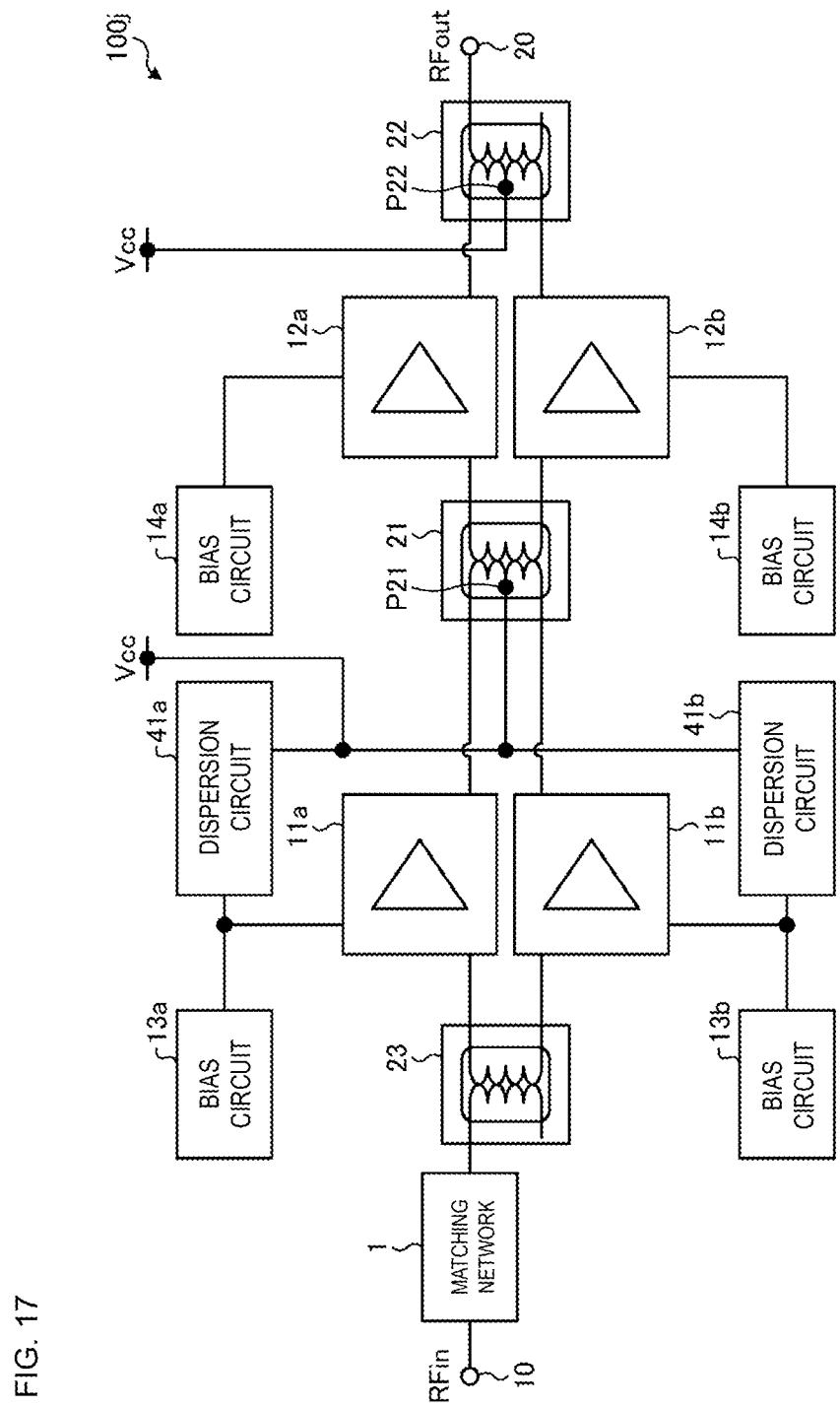
FIG. 17 illustrates a power amplifier circuit according to a ninth embodiment.

FIG. 17 illustrates a power amplifier circuit according to a ninth embodiment. As illustrated in FIG. 17, a power amplifier circuit 100j according to the ninth embodiment includes the amplifier circuits 11a and 11b forming a differential amplifier circuit, similarly to the power amplifier circuit 100h in FIG. 15. This means that the power amplifier circuit 100j includes the first differential amplifier circuit (the amplifier circuits 11a and 11b) and the second differential amplifier circuit (the amplifier circuits 12a and 12b) that are cascade-connected, and the transformer 21 is provided between the first differential amplifier circuit (the amplifier circuits 11a and 11b) and the second differential amplifier circuit (the amplifier circuits 12a and 12b).

In the power amplifier circuit 100j according to the ninth embodiment, the dispersion circuit 41a is coupled to the bias circuit 13a corresponding to the amplifier circuit 11a, and the dispersion circuit 41b is coupled to the bias circuit 13b corresponding to the amplifier circuit 11b. The dispersion circuit 41a adjusts a bias current to be supplied to the amplifier circuit 11a. The dispersion circuit 41b adjusts a bias current to be supplied to the amplifier circuit 11b.

In the power amplifier circuit 100j according to the ninth embodiment, the dispersion circuits 41a and 41b are coupled to the center tap, that is, the midpoint P21 of the primary winding of the transformer 21. The midpoint P21 is a virtual ground point of radio-frequency signal. Because the dispersion circuits 41a and 41b are coupled to the midpoint P21, the dispersion circuits 41a and 41b do not affect the symmetry of the differential amplifier circuit formed by the amplifier circuits 11a and 11b.

Tenth Embodiment

Figure 18:
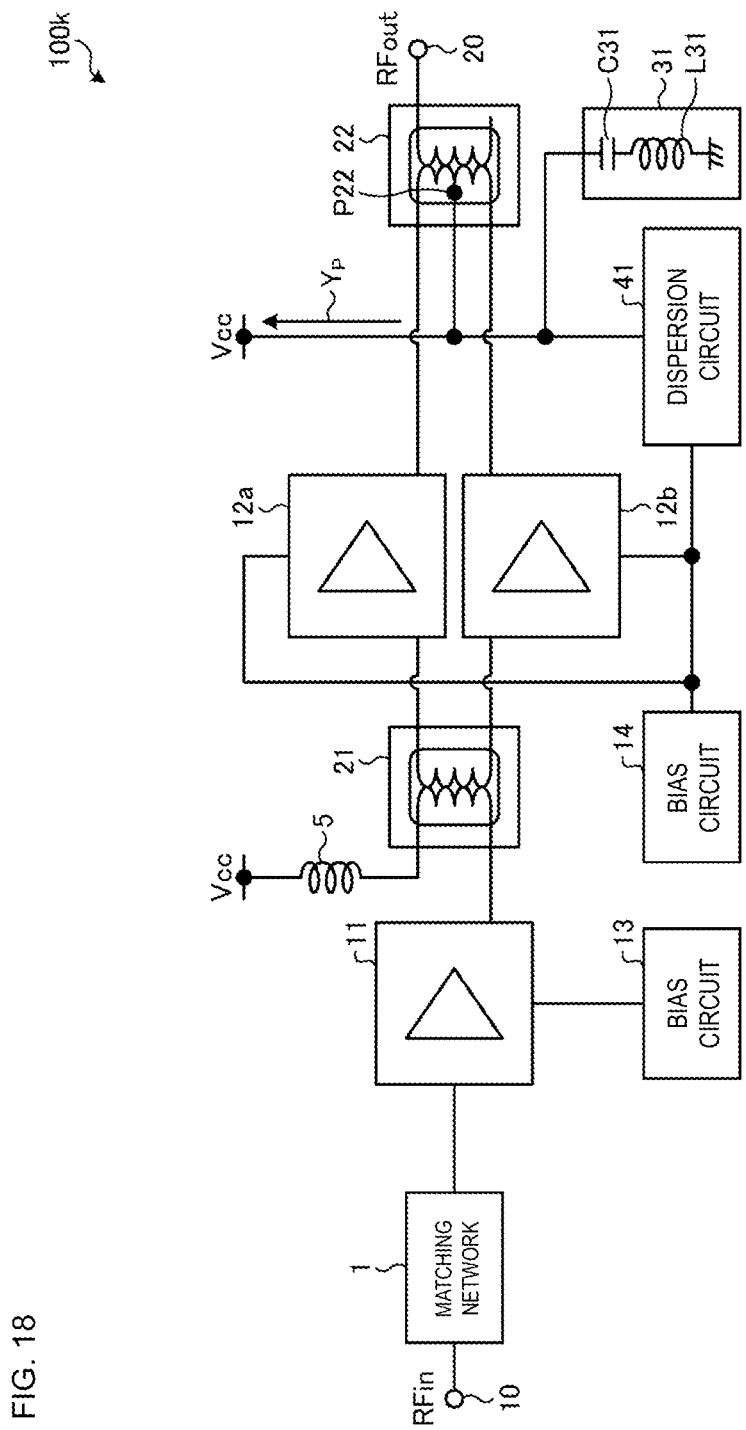
FIG. 18 illustrates a power amplifier circuit according to a tenth embodiment.

FIG. 18 illustrates a power amplifier circuit according to a tenth embodiment. As illustrated in FIG. 18, a power amplifier circuit 100k according to the tenth embodiment is formed by adding a filter 31, which is a high-cut filter, to the power amplifier circuit 100c in FIG. 7. The filter 31 is coupled between the center tap, that is, the midpoint P22 of the primary winding of the transformer 22 and the dispersion circuit 41. The filter 31 includes a capacitor C31 and an inductor L31 coupled in series with each other. One end of the capacitor C31 is coupled to the midpoint P22. The other end of the capacitor C31 is coupled to one end of the inductor L31. The other end of the inductor L31 is electrically coupled to the reference potential. The filter 31 is an LC series resonance circuit.

At the midpoint P22 of the transformer 22, signals at odd-order frequencies (fundamental frequency fo, third-order frequency 3fo, . . . ) of a transmit frequency fo cancel each other out, whereas signals at even-order frequencies (second-order frequency $2fo$, fourth-order frequency $4fo$, . . . ) do not cancel each other out. When a great amount of harmonic waves at even-order frequencies occur, the harmonic waves may leak into the supply voltage Vcc side. To avoid this, the filter 31 is added in the present embodiment. The filter 31 resonates at an even-order frequency (for example, second-order frequency $2fo$). Because the filter 31 is provided, it is possible to inhibit leakage of electric power at an even-order frequency, which is indicated by an arrow Yp, into the supply voltage Vcc.

Figure 19:
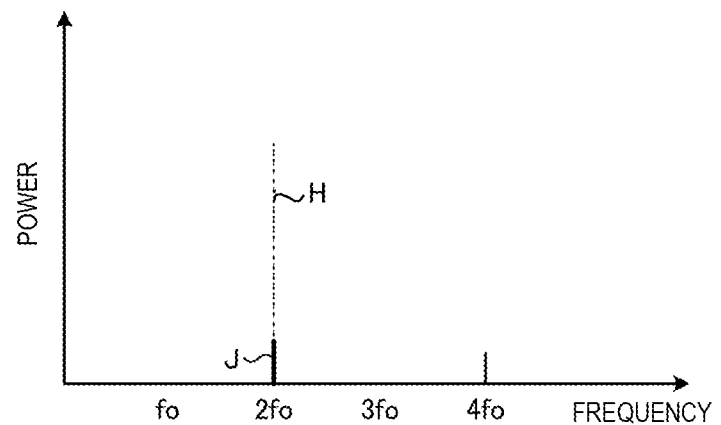
FIG. 19 illustrates examples of a characteristic of a filter.

FIG. 19 illustrates examples of a characteristic of the filter 31. The horizontal axis in FIG. 19 indicates the fundamental frequency fo, the second-order frequency $2fo$, the third-order frequency $3fo$, and the fourth-order frequency $4fo$. The vertical axis in FIG. 19 indicates electric power with respect to different frequencies. Regarding the second-order frequency $2fo$, a dashed line H indicates electric power in the case without necessarily the filter 31, and a solid line J indicates electric power in the case with the filter 31. As illustrated in FIG. 19, signals at odd-order frequencies (fundamental frequency fo, third-order frequency $3fo$, . . . ) of the transmit frequency fo cancel each other out at the midpoint P22 of the transformer 22. By contrast, signals at even-order frequencies (second-order frequency $2fo$, fourth-order frequency $4fo$, . . . ) do not cancel each other out. In the case with the filter 31, the electric power at the second-order frequency $2fo$ is greater than the electric power at the fourth-order frequency $4fo$ as indicated by the dashed line H. When the filter 31 configured to resonate at the second-order frequency $2fo$ is provided, the electric power at the second-order frequency $2fo$ decreases to almost the same amount as the electric power at the fourth-order frequency $4fo$. This means that, because the filter 31 is provided, it is possible to inhibit leakage of electric power at an even-order frequency, which is indicated by the arrow Yp in FIG. 18, into the supply voltage Vcc.

In FIG. 18, the midpoint P22 is a virtual ground point of radio-frequency signal. Thus, the filter 31 coupled to the midpoint P22 does not affect the symmetry of the differential amplifier circuit formed by the amplifier circuits 12a and 12b.

CONCLUSION

When a dispersion circuit that enables voltage-dependence is coupled to the supply voltage Vcc, the dispersion circuit is coupled to a midpoint of the primary side on the output side of a transformer. The midpoint of the transformer is a virtual ground point with respect to radio-frequency signals. Thus, when the amplitude of radio-frequency signal fluctuates due to a large amount of power from a power-stage amplifier circuit, the dispersion circuit can reflect feedback as a direct current (DC) from the supply voltage Vcc. As a result, malfunction can be hindered, and the effect of a gain dispersion circuit can be achieved.

Concerning a differential amplifier circuit, two pairs of transistors are provided to combine outputs from two branched amplifier circuits. Because the outputs from the two amplifier circuits are combined together, the symmetry of the two amplifier circuits is important. Because the midpoint of the transformer is a virtual ground point of radio-frequency signal, the element coupled to the midpoint does not need to exhibit symmetry.

When only a single bias circuit is provided, the single bias circuit needs to be disposed between two amplifier circuits (exactly at half of two amplifier circuits) to exhibit symmetry. As described above, because the dispersion circuit is coupled to the midpoint of the transformer, the symmetry in the physical layout can be easily maintained.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A power amplifier circuit comprising:
   at least one differential amplifier circuit configured to amplify a radio-frequency signal;
   a transformer on an output side of the at least one differential amplifier circuit, the transformer comprising a primary winding and a secondary winding; and
   an adjustment circuit coupled to a midpoint of the primary winding of the transformer, the adjustment circuit being configured to adjust a bias current or a bias voltage supplied to the at least one differential amplifier circuit based on a supply voltage controlled in accordance with an envelope of the radio-frequency signal.

2. The power amplifier circuit according to claim 1, wherein:
   the at least one differential amplifier circuit comprises a first differential amplifier circuit and a second differential amplifier circuit that are cascade-connected, and
   the transformer is between the first differential amplifier circuit and the second differential amplifier circuit.

3. The power amplifier circuit according to claim 2, wherein the adjustment circuit is configured to adjust the bias current or the bias voltage supplied to the first differential amplifier circuit.

4. The power amplifier circuit according to claim 2, wherein the adjustment circuit is configured to adjust the bias current or the bias voltage supplied to the second differential amplifier circuit.

5. The power amplifier circuit according to claim 1, further comprising:
   a high-cut filter electrically coupled to the midpoint of the primary winding.

6. The power amplifier circuit according to claim 2, further comprising:
   a high-cut filter electrically coupled to the midpoint of the primary winding.

7. The power amplifier circuit according to claim 1, wherein:
   the transformer has a multilayer substrate including a plurality of layers stacked together, and
   the primary winding and the secondary winding are at different layers of the multilayer substrate.

8. The power amplifier circuit according to claim 2, wherein:
   the transformer has a multilayer substrate including a plurality of layers stacked together, and
   the primary winding and the secondary winding are at different layers of the multilayer substrate.

9. The power amplifier circuit according to claim 1, wherein:
   an input of the adjustment circuit is electrically coupled to the midpoint of the primary winding of the transformer and to the supply voltage, and
   an output of the adjustment circuit is electrically coupled to an output of a bias circuit configured to supply the bias current or the bias voltage.

10. The power amplifier circuit according to claim 9, wherein the adjustment circuit comprises:
- a transistor;
- a first resistor connected between the midpoint of the primary winding and a collector of the transistor; and
- a second resistor connected between a base of a bias transistor and a base of the transistor, the bias current or the bias voltage being output from an emitter of the bias transistor, and wherein an emitter of the transistor is electrically coupled to the emitter of the bias transistor.

11. The power amplifier circuit according to claim 10, wherein the adjustment circuit further comprises:
- a third resistor connected between the emitter of the bias transistor and the emitter of the transistor.

* * * * *